(12) United States Patent
Lee et al.

(10) Patent No.: US 12,324,170 B2
(45) Date of Patent: Jun. 3, 2025

(54) CAPACITOR STRUCTURE AND MANUFACTURING METHOD THEREOF

(71) Applicant: Powerchip Semiconductor Manufacturing Corporation, Hsinchu (TW)

(72) Inventors: Shih-Ping Lee, Hsinchu (TW); Yu-Cheng Lu, Miaoli County (TW); Chia-Hao Yu, Taichung (TW); Yeh-Yu Chiang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 321 days.

(21) Appl. No.: 17/946,048

(22) Filed: Sep. 16, 2022

(65) Prior Publication Data

US 2024/0030358 A1     Jan. 25, 2024

(30) Foreign Application Priority Data

Jul. 21, 2022    (TW) ................................. 111127294

(51) Int. Cl.
*H10D 1/62* (2025.01)
*H10D 1/00* (2025.01)
*H10D 64/01* (2025.01)

(52) U.S. Cl.
CPC ............... *H10D 1/62* (2025.01); *H10D 1/045* (2025.01); *H10D 64/01* (2025.01)

(58) Field of Classification Search
CPC .......... H10D 1/62; H10D 1/045; H10D 64/01; H10D 1/684; F27D 17/28

USPC .......................................................... 257/296
See application file for complete search history.

(56) References Cited

U.S. PATENT DOCUMENTS

| 6,852,590 | B1* | 2/2005 | Tsai ................... H10B 12/0385 |
|           |     |        |                          438/389 |
| 7,071,071 | B2  | 7/2006 | Iijima et al. |
| 8,748,284 | B2  | 6/2014 | Tzeng et al. |
| 9,263,415 | B2  | 2/2016 | Tzeng et al. |

(Continued)

FOREIGN PATENT DOCUMENTS

TW         202220212        5/2022

OTHER PUBLICATIONS

S.Y. Hou, et al., "Integrated Deep Trench Capacitor in Si Interposer for CoWoS Heterogeneous Integration," 2019 IEEE International Electron Devices Meeting (IEDM), Dec. 2019, pp. 1-4.

(Continued)

*Primary Examiner* — Sheikh Maruf
(74) *Attorney, Agent, or Firm* — JCIPRNET

(57) ABSTRACT

A capacitor structure including a silicon material layer, a support frame layer, and a capacitor is provided. The support frame layer is disposed in the silicon material layer. The support frame layer has recesses. There is a cavity between two adjacent recesses. The support frame layer is located between the cavity and the recess. The support frame layer has a through hole directly above the cavity. The capacitor is disposed in the silicon material layer. The capacitor includes a first insulating layer and a first electrode layer. The first insulating layer is disposed on the support frame layer. The first electrode layer is disposed on the first insulating layer and fills the recess and the cavity.

9 Claims, 30 Drawing Sheets

(56) References Cited

U.S. PATENT DOCUMENTS

| | | |
|---|---|---|
| 9,577,025 B2 | 2/2017 | Gu et al. |
| 9,691,684 B2 | 6/2017 | Park et al. |
| 2004/0209055 A1 | 10/2004 | Lee et al. |
| 2008/0045034 A1 | 2/2008 | Shea et al. |
| 2012/0211865 A1* | 8/2012 | Tian .................. H10D 1/68 257/532 |
| 2013/0161792 A1* | 6/2013 | Tran .................. H10D 1/62 438/386 |
| 2014/0042590 A1* | 2/2014 | Chen ................ H10D 1/692 257/532 |
| 2014/0080282 A1* | 3/2014 | Chiang ............ H10B 12/033 257/E21.011 |
| 2014/0374880 A1* | 12/2014 | Chen ................ H10B 12/37 257/532 |
| 2015/0348714 A1* | 12/2015 | Morris ............... H01G 5/16 307/109 |
| 2017/0092371 A1* | 3/2017 | Harari ............. H10D 30/693 |
| 2019/0067298 A1* | 2/2019 | Karda .............. G11C 11/408 |
| 2020/0027934 A1* | 1/2020 | Sakaguchi .......... H10D 8/422 |
| 2020/0176552 A1* | 6/2020 | Chang ............. H01L 21/2855 |
| 2021/0020652 A1* | 1/2021 | Li .................... H10B 43/27 |
| 2021/0217883 A1* | 7/2021 | Jones ............... H10D 84/05 |
| 2022/0223521 A1* | 7/2022 | Chiu ............... H01L 23/535 |
| 2022/0376037 A1* | 11/2022 | Fang .................. H10D 8/00 |
| 2022/0416037 A1* | 12/2022 | Togo ............... H10D 30/601 |
| 2023/0069774 A1* | 3/2023 | Chang ................ H01G 2/02 |

OTHER PUBLICATIONS

C. Roda Neve, et al., "High-density and low-leakage novel embedded 3D MIM capacitor on Si interposer," 2016 IEEE International 3D Systems Integration Conference (3DIC), Nov. 2016, pp. 1-4.

Li Zhang, et al., "A novel design of super-capcitor based on black silicon with atomic layer deposition," 2013 IEEE International Conference of Electron Devices and Solid-state Circuits, Jun. 2013, pp. 1-2.

TSMC, "Chip-on-Wafer-on-Substrate (CoWoS)", WikiChip, retrieved from "https://en.wikichip.org/wiki/tsmc/cowos", pp. 1-8.

"Office Action of Taiwan Counterpart Application", issued on Apr. 13, 2023, p. 1-p. 6.

* cited by examiner

CAPACITOR STRUCTURE AND MANUFACTURING METHOD THEREOF

CROSS-REFERENCE TO RELATED APPLICATION

This application claims the priority benefit of Taiwan application serial no. 111127294, filed on Jul. 21, 2022. The entirety of the above-mentioned patent application is hereby incorporated by reference herein and made a part of this specification.

BACKGROUND

Technical Field

The invention relates to a semiconductor structure and a manufacturing method thereof, and particularly relates to a capacitor structure and a manufacturing method thereof.

Description of Related Art

In the current semiconductor industry, the capacitor is a very important basic device. For example, the basic design of a common capacitor structure is to insert an insulating material between electrode plates, so that two adjacent electrode plates and the insulating material therebetween form a capacitor unit. However, how to effectively increase the capacitance value of the capacitor is the goal of continuous efforts.

SUMMARY

The invention provides a capacitor structure and a manufacturing method thereof, which can effectively increase the capacitance value of the capacitor.

The invention provides a capacitor structure, which includes a silicon material layer, a support frame layer, and a capacitor. The support frame layer is disposed in the silicon material layer. The support frame layer has recesses. There is a cavity between two adjacent recesses. The support frame layer is located between the cavity and the recess. The support frame layer has a through hole directly above the cavity. The capacitor is disposed in the silicon material layer. The capacitor includes a first insulating layer and a first electrode layer. The first insulating layer is disposed on the support frame layer. The first electrode layer is disposed on the first insulating layer and fills the recess and the cavity.

According to an embodiment of the invention, in the capacitor structure, the material of the silicon material layer is, for example, epitaxial silicon, polysilicon, or single crystal silicon.

According to an embodiment of the invention, in the capacitor structure, a portion of the support frame layer may be located outside the silicon material layer.

According to an embodiment of the invention, in the capacitor structure, a portion of the capacitor may be located outside the silicon material layer.

According to an embodiment of the invention, in the capacitor structure, the recesses may include a ring-shaped recess, and the ring-shaped recess may surround the rest of the recesses.

According to an embodiment of the invention, in the capacitor structure, the material of the support frame layer may be a conductive material, and the capacitor may further include the support frame layer.

According to an embodiment of the invention, in the capacitor structure, the material of the support frame layer may be a dielectric material, and the capacitor may further include a second electrode layer. The second electrode layer is disposed between the first insulating layer and the support frame layer.

According to an embodiment of the invention, in the capacitor structure, the first electrode layer may include a first conductive layer and a second conductive layer. The first conductive layer is disposed on the first insulating layer. The second conductive layer is disposed on the first conductive layer and fills the recess and the cavity.

According to an embodiment of the invention, the capacitor structure may further include a substrate. The silicon material layer is disposed on the substrate. The silicon material layer and the substrate may have the same conductivity type. The dopant concentration of the silicon material layer may be less than the dopant concentration of the substrate.

According to an embodiment of the invention, the capacitor structure may further include a substrate and a second insulating layer. The silicon material layer is disposed on the substrate. The second insulating layer is disposed between the silicon material layer and the substrate.

The invention provides a manufacturing method of a capacitor structure, which includes the following steps. A silicon material layer is provided. A support frame layer is formed in the silicon material layer. The support frame layer has recesses. There is a cavity between two adjacent recesses. The support frame layer is located between the cavity and the recess. The support frame layer has a through hole directly above the cavity. A capacitor is formed in the silicon material layer. The capacitor includes a first insulating layer and a first electrode layer. The first insulating layer is disposed on the support frame layer. The first electrode layer is disposed on the first insulating layer and fills the recess and the cavity.

According to an embodiment of the invention, in the manufacturing method of the capacitor structure, the method of forming the support frame layer may include the following steps. Openings are formed in the silicon material layer. A support frame material layer is conformally formed on the silicon material layer and in the openings. The support frame material layer is patterned to form the support frame layer and the through hole. The through holes may expose the silicon material layer.

According to an embodiment of the invention, in the manufacturing method of the capacitor structure, the openings may include a ring-shaped opening, and the ring-shaped opening may surround the rest of the openings.

According to an embodiment of the invention, in the manufacturing method of the capacitor structure, the method of forming the cavity may include removing a portion of the silicon material layer exposed by the through hole. The method of removing the portion of the silicon material layer exposed by the through hole is, for example, a wet etching method.

According to an embodiment of the invention, the manufacturing method of the capacitor structure may further include the following steps. A substrate is provided. The silicon material layer may be formed on the substrate. The silicon material layer and the substrate may have the same conductivity type. The dopant concentration of the silicon material layer may be less than the dopant concentration of the substrate.

According to an embodiment of the invention, in the manufacturing method of the capacitor structure, the portion of the silicon material layer exposed by the through hole may be removed by using the substrate as a stop layer.

According to an embodiment of the invention, the manufacturing method of the capacitor structure may further include the following steps. A substrate is provided. A second insulating layer is provided. The second insulating layer is located between the silicon material layer and the substrate.

According to an embodiment of the invention, in the manufacturing method of the capacitor structure, the portion of the silicon material layer exposed by the through hole may be removed by using the second insulating layer as a stop layer.

According to an embodiment of the invention, in the manufacturing method of the capacitor structure, the material of the support frame layer may be a conductive material, and the capacitor may further include the support frame layer.

According to an embodiment of the invention, in the manufacturing method of the capacitor structure, the material of the support frame layer may be a dielectric material, and the capacitor may further include a second electrode layer. The second electrode layer is disposed between the first insulating layer and the support frame layer.

Based on the above description, in the capacitor structure and the manufacturing method thereof according to the invention, the support frame layer has the recesses, there is the cavity between two adjacent recesses, the support frame layer is located between the cavity and the recess, the support frame layer has the through hole directly above the cavity, the first insulating layer is disposed on the support frame layer, and the first electrode layer is disposed on the first insulating layer and fills the recess and the cavity. Therefore, the first electrode layer can have a larger area, thereby effectively increasing the capacitance value of the capacitor.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

FIG. 1A to FIG. 1G are cross-sectional views illustrating a manufacturing process of a capacitor structure according to some embodiments of the invention. FIG. 2A to FIG. 2D are top views illustrating some stages of a manufacturing process of a capacitor structure according to some embodiments of the invention. FIG. 1A to FIG. 1G are cross-sectional views taken along section line I-I' in FIG. 2A to FIG. 2D. FIG. 3A and FIG. 3B are cross-sectional views illustrating some stages of a manufacturing process of a capacitor structure according to some embodiments of the invention. FIG. 3A to FIG. 3B are cross-sectional views taken along section line II-II' in FIG. 2D. In the top view of the present embodiment, some components in the cross-sectional view are omitted to clearly illustrate the configuration relationship between the components in the top view.

Figure 1A:
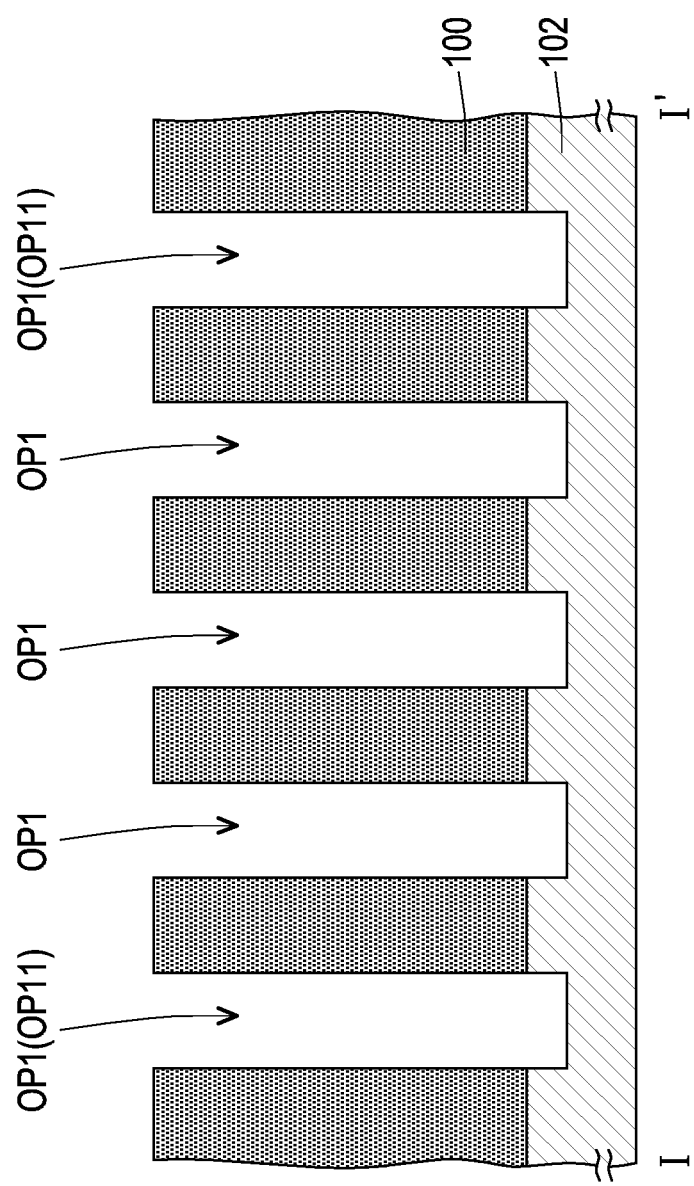
FIG. 1A to FIG. 1G are cross-sectional views illustrating a manufacturing process of a capacitor structure according to some embodiments of the invention.
Figure 2A:
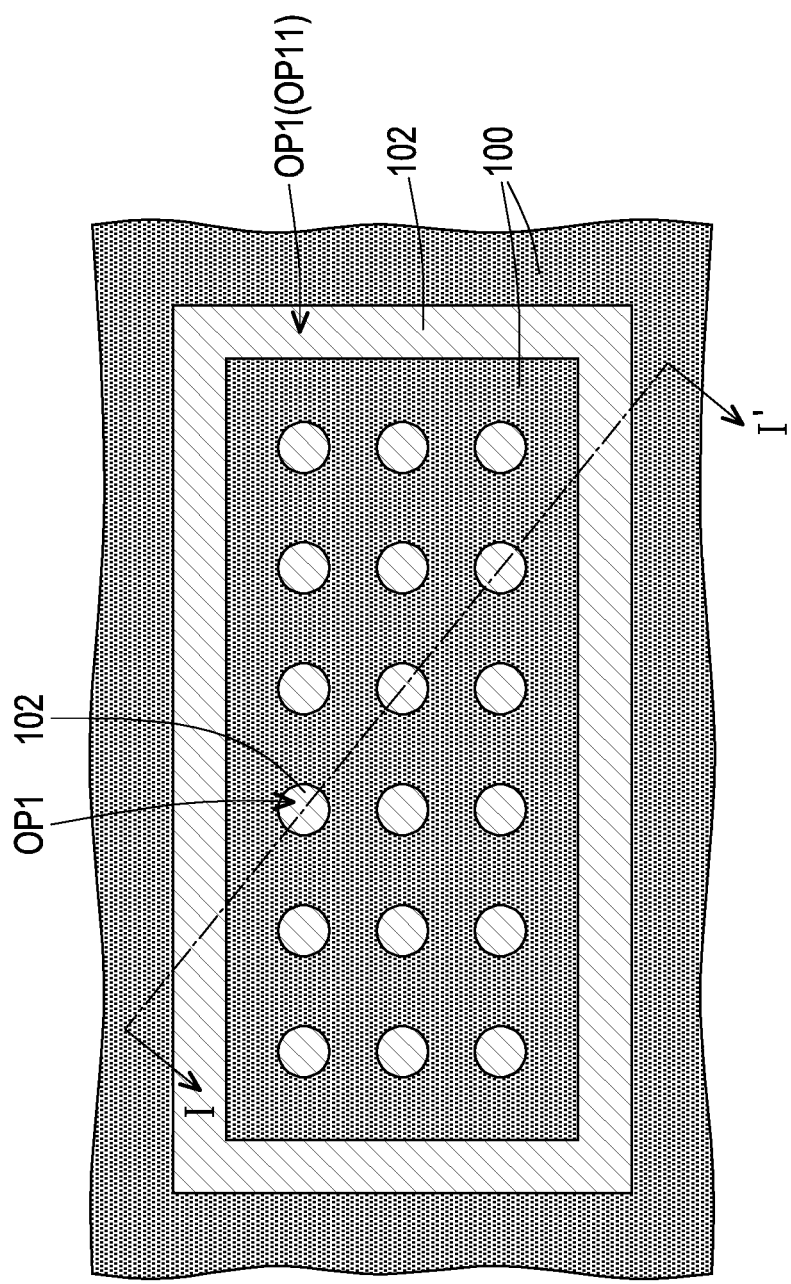
FIG. 2A to FIG. 2D are top views illustrating some stages of a manufacturing process of a capacitor structure according to some embodiments of the invention.
Figure 3A:
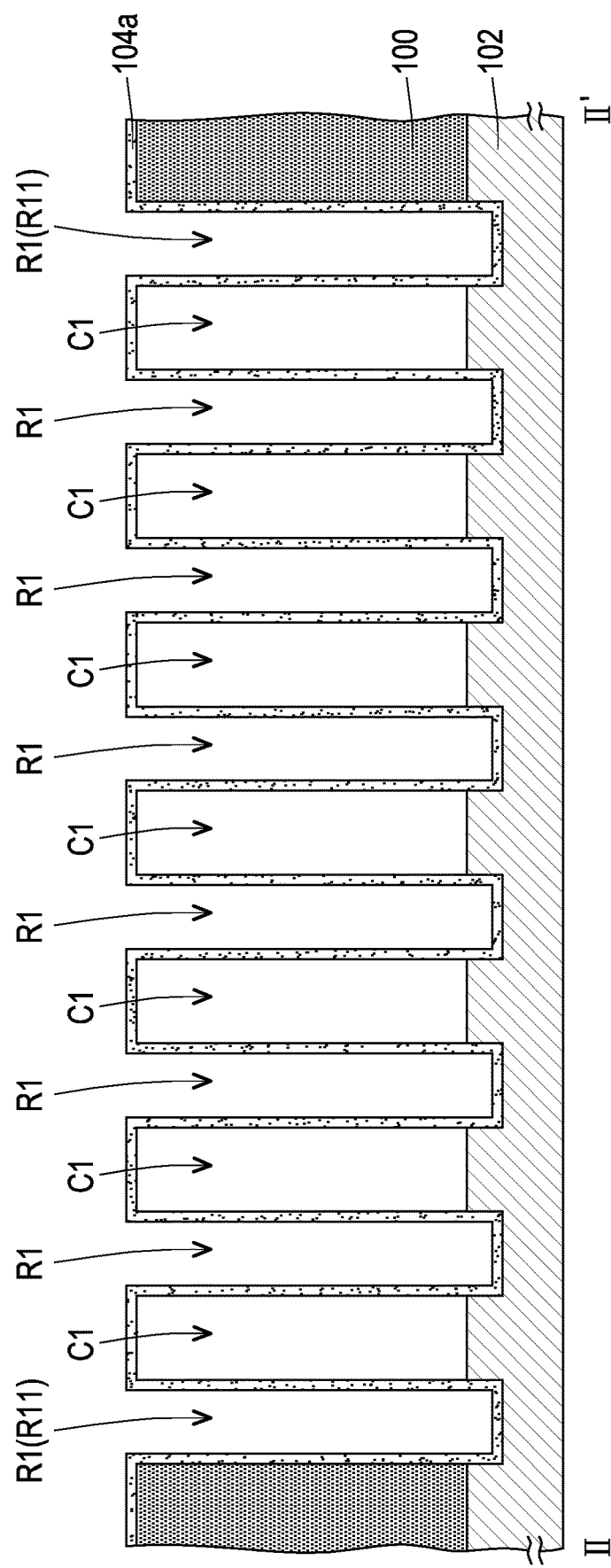
FIG. 3A and FIG. 3B are cross-sectional views illustrating some stages of a manufacturing process of a capacitor structure according to some embodiments of the invention.
Figure 3B:
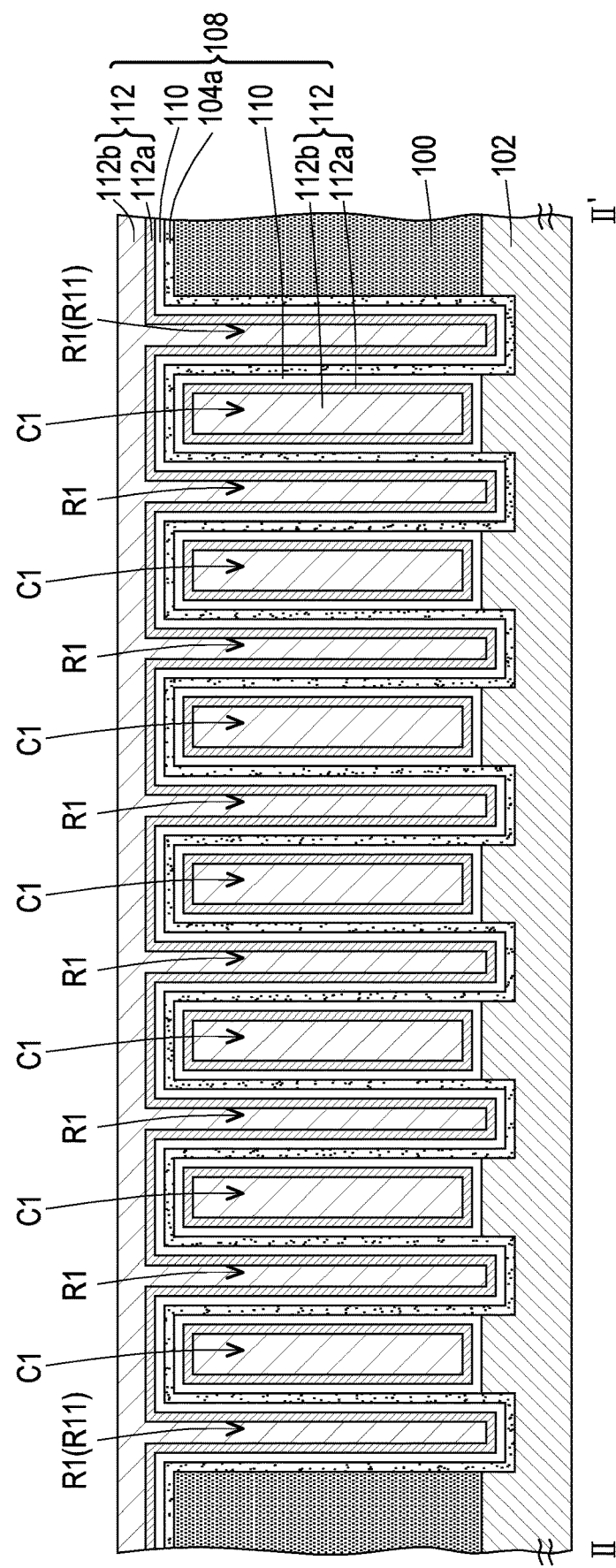

Referring to FIG. 1A and FIG. 2A, a silicon material layer 100 is provided. In some embodiments, the material of the silicon material layer 100 is, for example, epitaxial silicon or polysilicon, but the invention is not limited thereto. In some embodiments, a substrate 102 may be further provided. The substrate 102 may be a semiconductor substrate such as a single crystal silicon substrate. Furthermore, the silicon material layer 100 may be formed on the substrate 102. The silicon material layer 100 and the substrate 102 may have the same conductivity type. In some embodiments, the silicon material layer 100 and the substrate 102 may have a P-type conductivity type. In other embodiments, the silicon material layer 100 and the substrate 102 may have an N-type conductivity type. The dopant concentration of the silicon material layer 100 may be less than the dopant concentration of the substrate 102. For example, the silicon material layer 100 and the substrate 102 may have the P-type conductivity type, and the P-type dopant concentration of the silicon material layer 100 may be less than the P-type dopant concentration of the substrate 102. The method of forming the silicon material layer 100 is, for example, an epitaxial growth method or a chemical vapor deposition method.

Openings OP1 may be formed in the silicon material layer 100. In some embodiments, the silicon material layer 100 may be patterned by a lithography process and an etching process (e.g., dry etching process) to form the openings OP1. The openings OP1 may include a ring-shaped opening OP11, and the ring-shaped opening OP11 may surround the rest of the openings OP1. In some embodiments, during the process of forming the opening OP1, a portion of the substrate 102 may be removed, so that the opening OP1 may extend into the substrate 102.

Figure 1B:
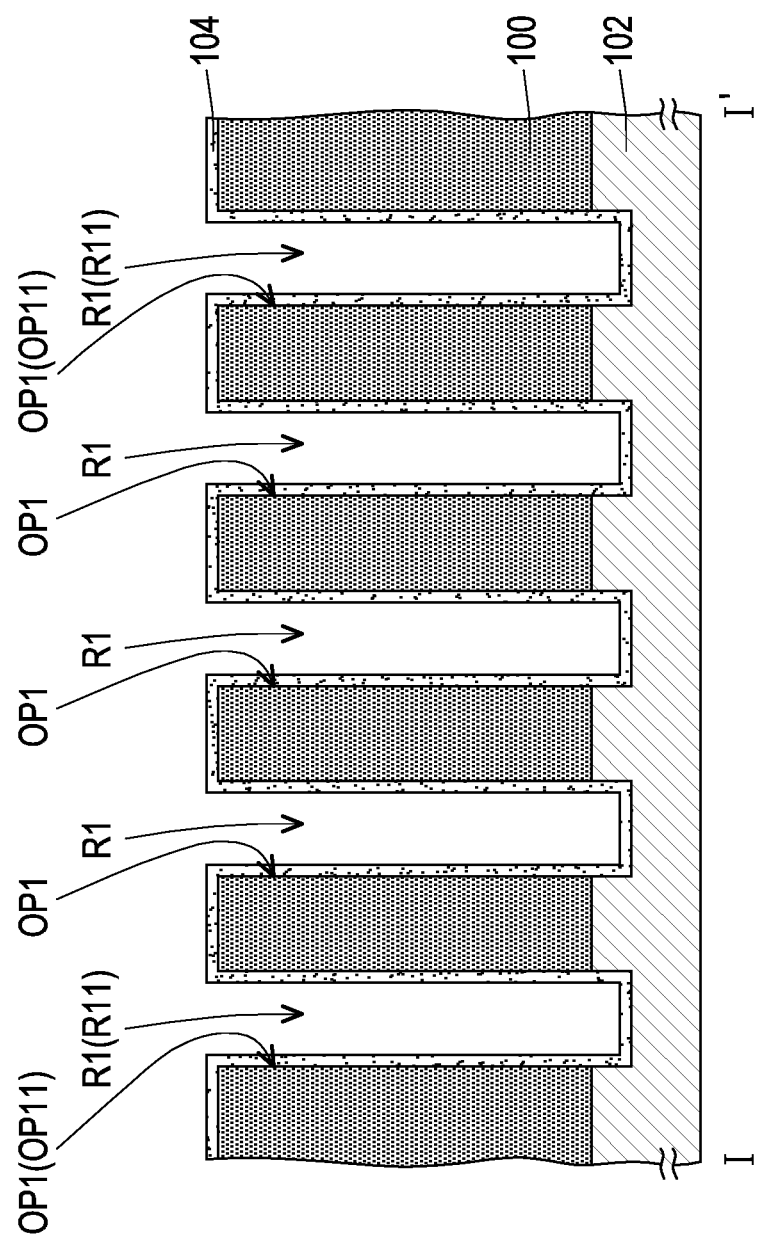
Figure 2B:
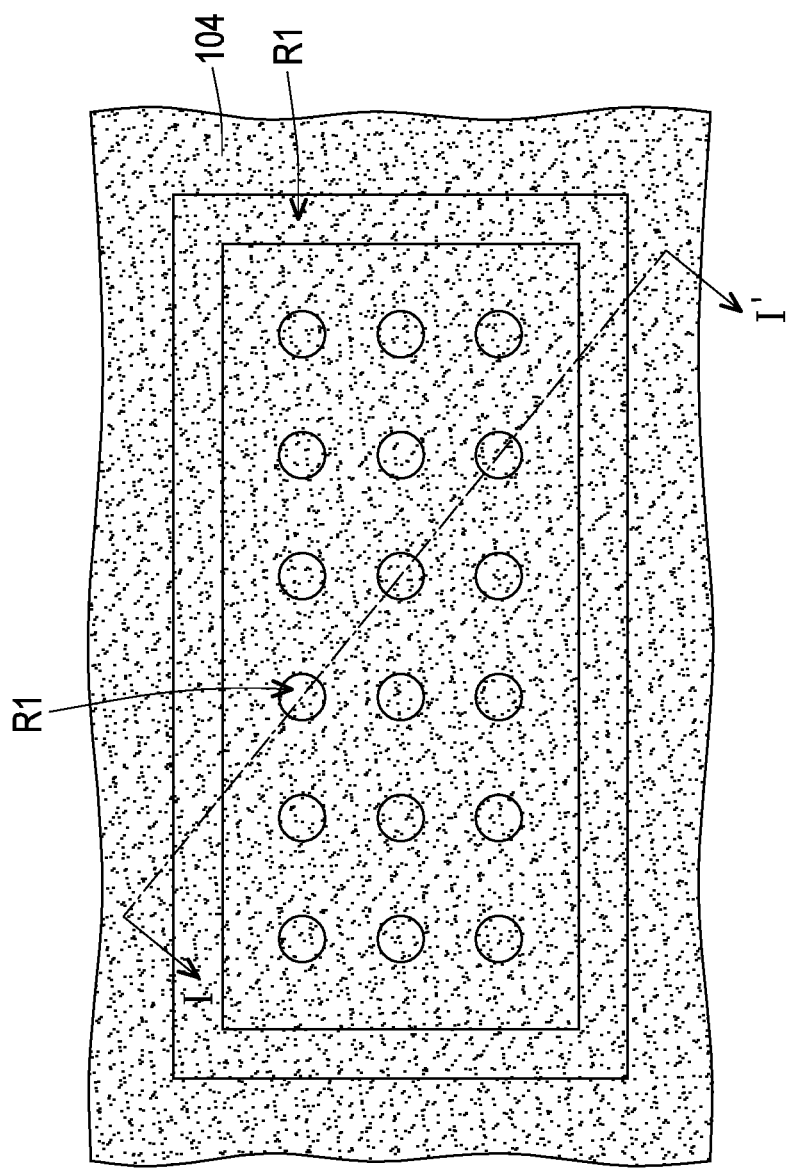

Referring to FIG. 1B and FIG. 2B, a support frame material layer 104 may be conformally formed on the silicon material layer 100 and in the openings OP1. The support frame material layer 104 may have recesses R1. In some embodiments, the material of the support frame material layer 104 may be a conductive material such as titanium nitride, but the invention is not limited thereto. The method of forming the support frame material layer 104 is, for example, a chemical vapor deposition (CVD) method, a physical vapor deposition (PVD) method, or an atomic layer deposition (ALD) method.

Figure 1C:
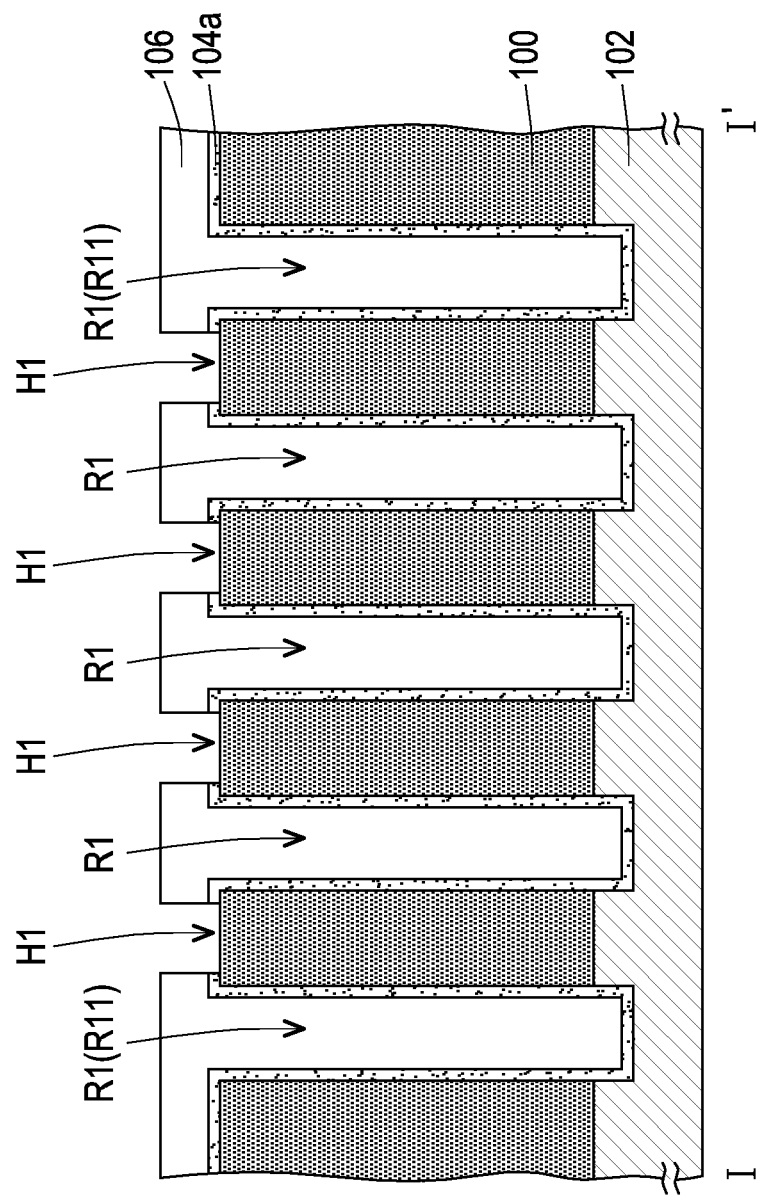
Figure 2C:
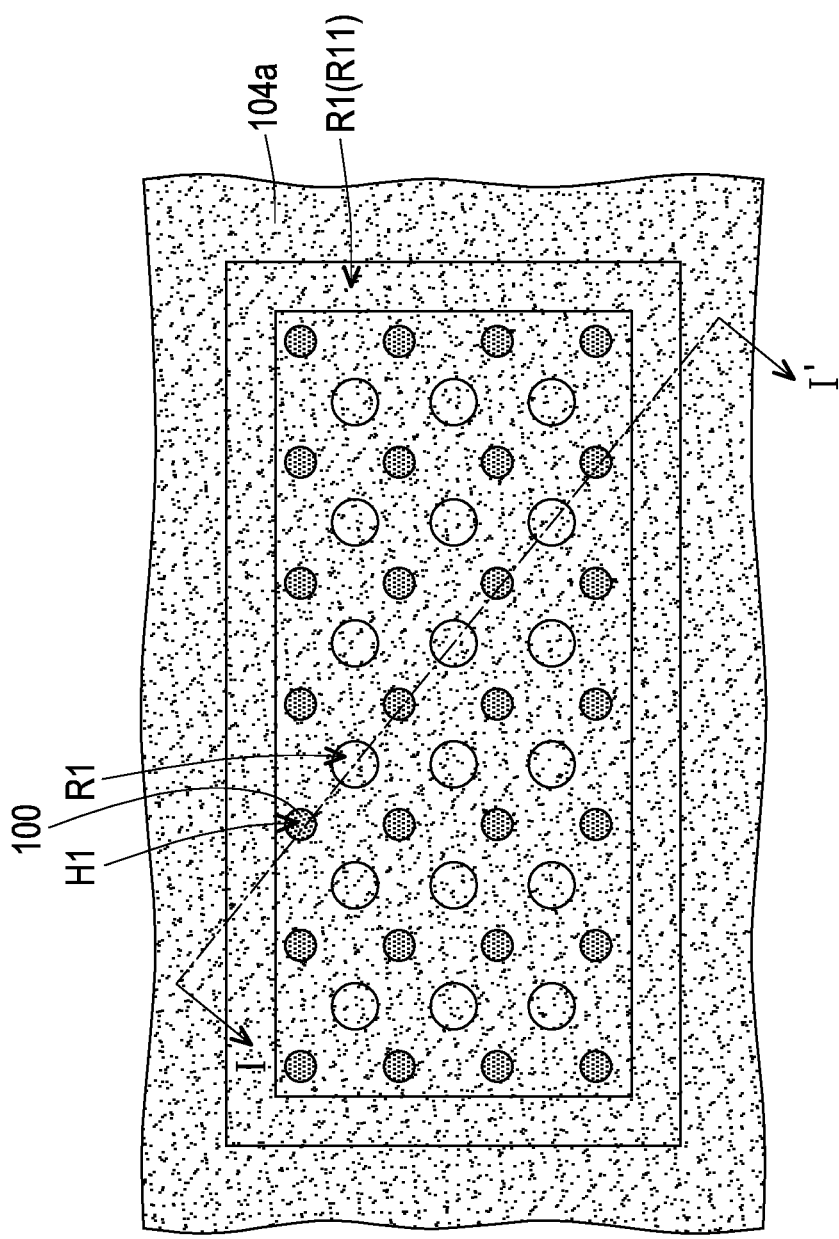

Referring to FIG. 1C and FIG. 2C, a patterned photoresist layer 106 may be formed on the support frame material layer 104. The patterned photoresist layer 106 may expose a portion of the support frame material layer 104. In some embodiments, the patterned photoresist layer 106 may be formed by a lithography process.

A portion of the support frame material layer 104 may be removed by using the patterned photoresist layer 106 as a mask. Therefore, the support frame material layer 104 may be patterned to form a support frame layer 104a and a through hole H1. The through hole H1 may expose the silicon material layer 100. In addition, the support frame layer 104a may be formed in the silicon material layer 100 by the above method. The support frame layer 104a has recesses R1. The recesses R1 may include a ring-shaped recess R11, and the ring-shaped recess R11 may surround the rest of the recesses R1. The material of the support frame layer 104a may be a conductive material such as titanium nitride, but the invention is not limited thereto. In some embodiments, the method of removing the portion of the support frame material layer 104 is, for example, a dry etching method such as a reactive ion etching (RIE) method.

Figure 1D:
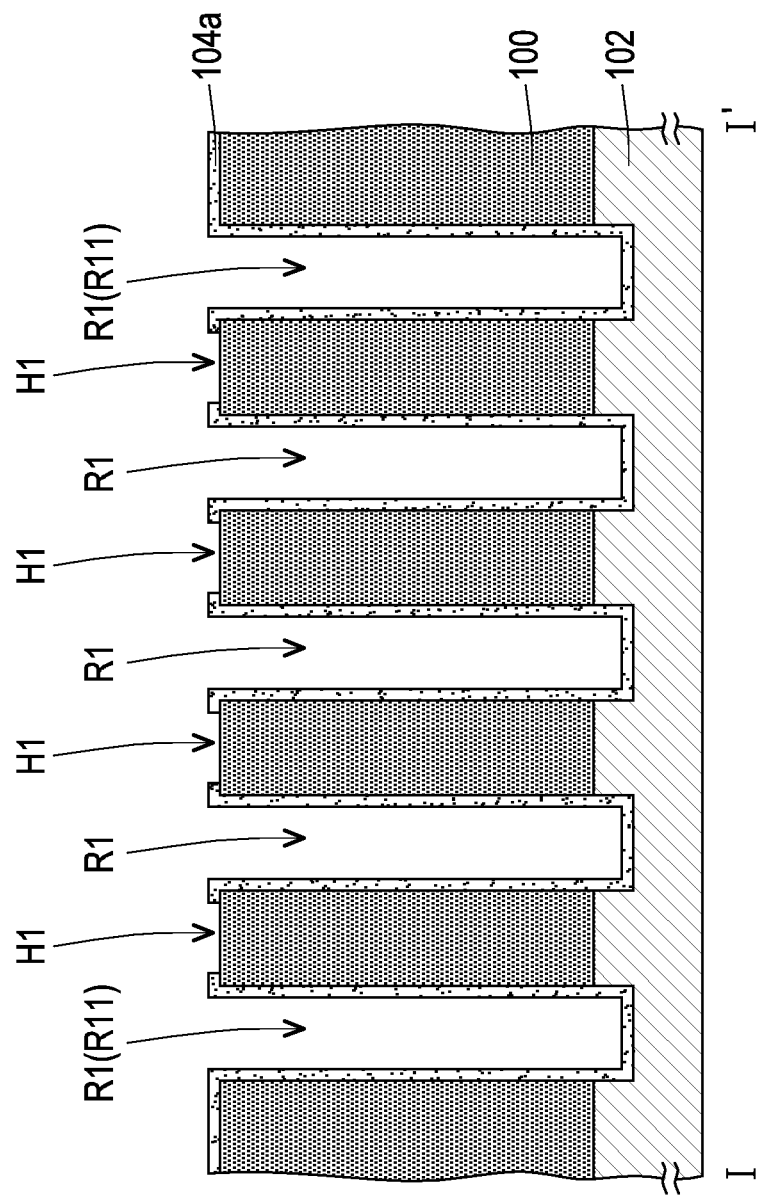

Referring to FIG. 1D, the patterned photoresist layer 106 may be removed. The method of removing the patterned photoresist layer 106 is, for example, a dry stripping method or a wet stripping method.

Figure 1E:
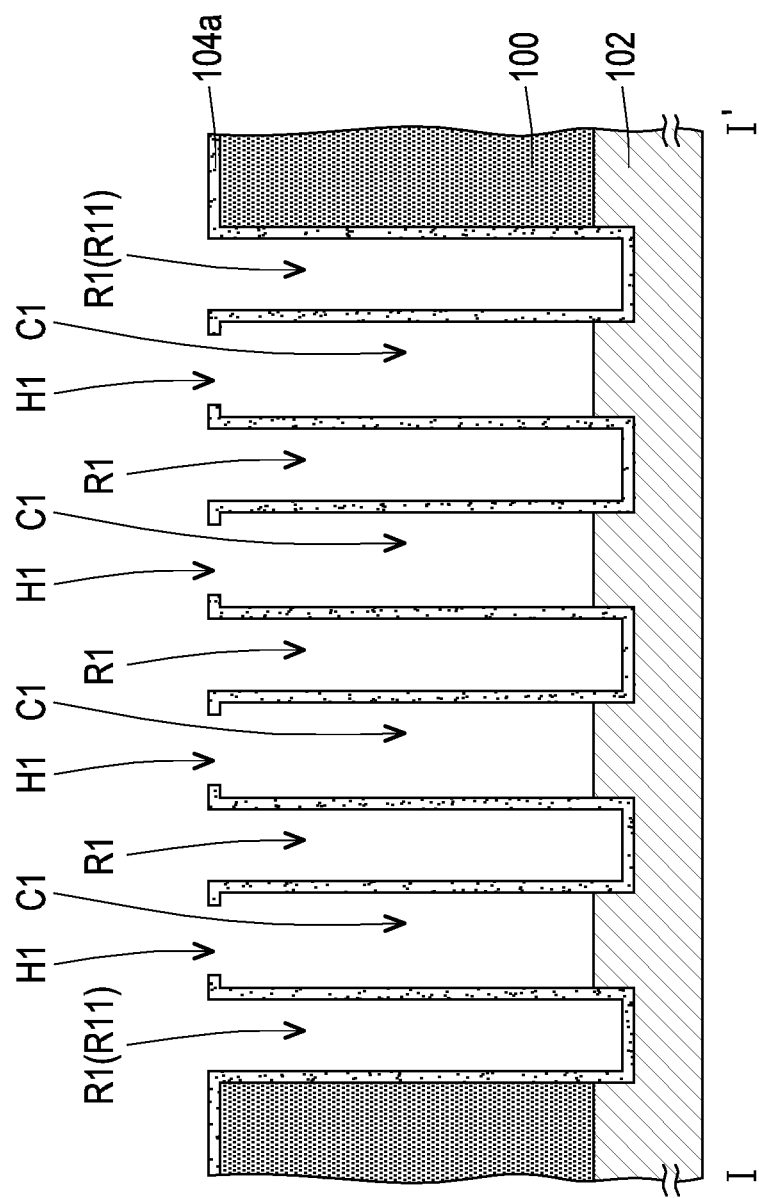
Figure 2D:
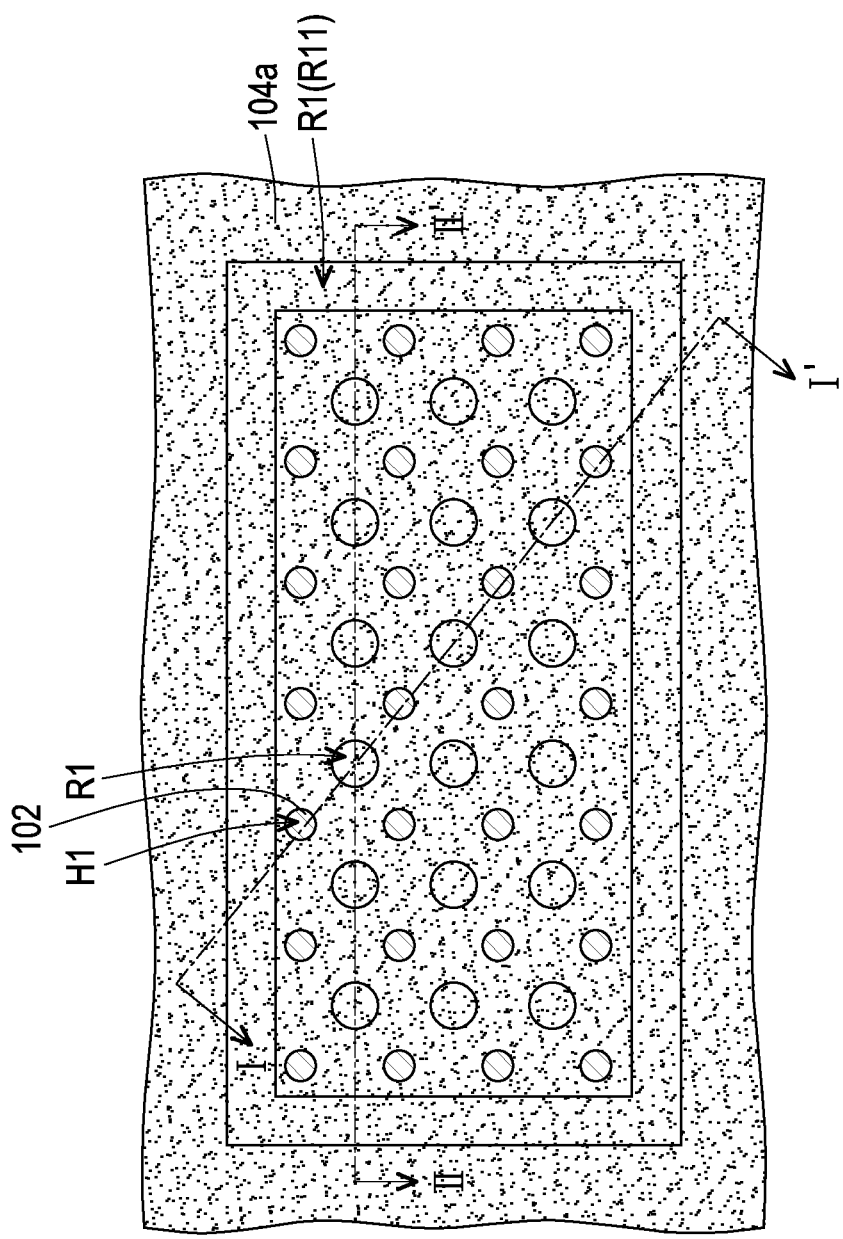

Referring to FIG. 1E and FIG. 2D, a portion of the silicon material layer 100 exposed by the through hole H1 may be removed to form a cavity C1 between two adjacent recesses R1. The method of removing the portion of the silicon material layer 100 exposed by the through hole H1 is, for example, a wet etching method. The etchant used in the wet etching method may include tetramethylammonium hydroxide (TMAH), potassium hydroxide (KOH), ethylenediamine pyrocatechol (EDP), hydrofluoric acid-nitric acid-acetic acid (HNA), or a combination thereof. In some embodiments, the portion of the silicon material layer 100 exposed by the through hole H1 may be removed by using the substrate 102 as a stop layer. For example, when TMAH is used as the etchant of the wet etching method and the dopant concentration (e.g., P-type dopant concentration) of the silicon material layer 100 is less than the dopant concentration (e.g., P-type dopant concentration) of the substrate 102, since the removal rate of TMAH to the silicon material layer 100 is greater than the removal rate of TMAH to the substrate 102, the portion of the silicon material layer 100 exposed by the through hole H1 may be removed by using the substrate 102 as a stop layer.

In some embodiments, as shown in FIG. 3A, in the wet etching process of removing the portion of the silicon material layer 100 exposed by the through hole H1, a portion of the silicon material layer 100 located between the recesses R1 and not located directly below the through hole H1 may be further removed to form the cavity C1 between two adjacent recesses R1.

In addition, there is a cavity C1 between two adjacent recesses R1. The support frame layer 104a is located between the cavity C1 and the recess R1. In some embodiments, the cavity C1 and the recess R1 are separated from each other by the support frame layer 104a. The support frame layer 104a has a through hole H1 directly above the cavity C1.

Figure 1F:
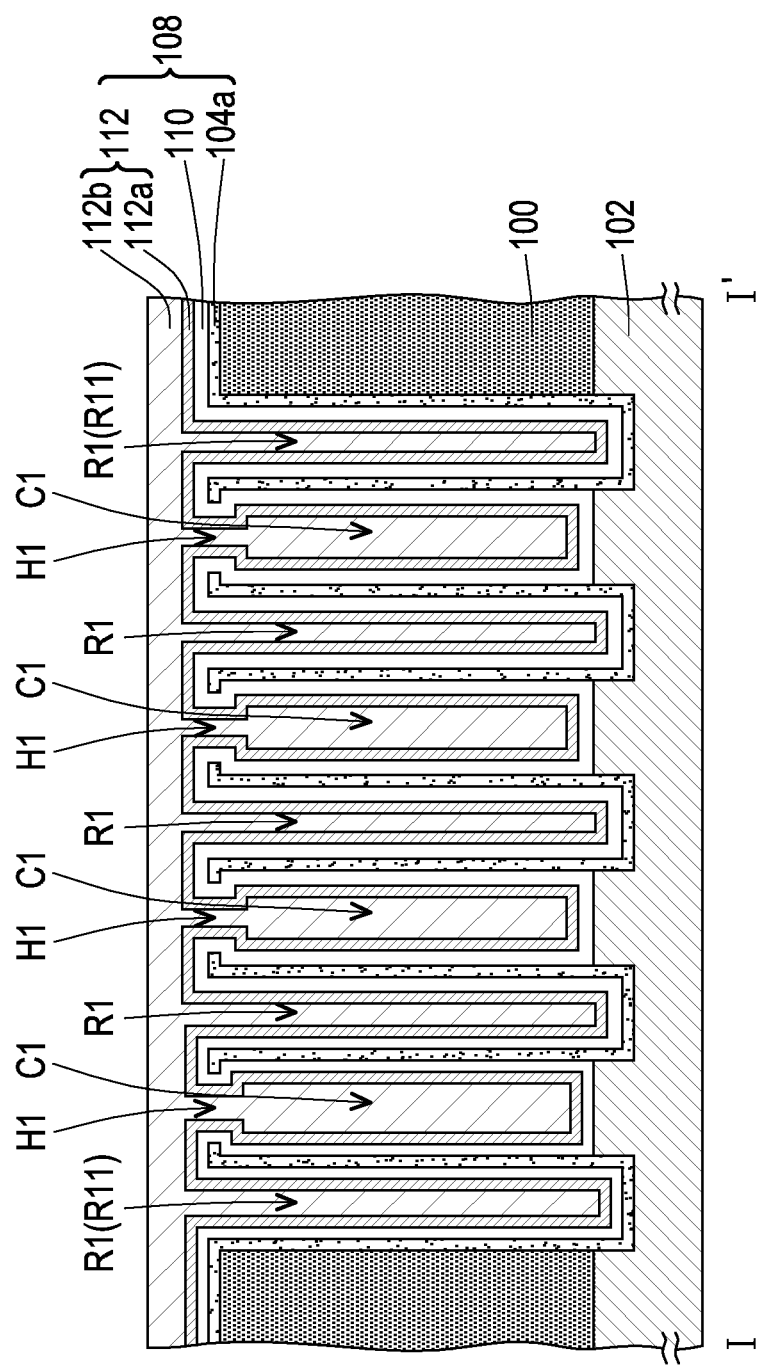

Referring to FIG. 1F and FIG. 3B, a capacitor 108 is formed in the silicon material layer 100. The capacitor 108 includes an insulating layer 110 and an electrode layer 112. In the present embodiment, the material of the support frame layer 104a may be a conductive material, and the capacitor 108 may further include the support frame layer 104a. The insulating layer 110 is disposed on the support frame layer 104a. In some embodiments, the insulating layer 110 may be conformally disposed on the support frame layer 104a. The material of the insulating layer 110 is, for example, a high dielectric constant material. The method of forming the insulating layer 110 is, for example, a CVD method, a PVD method, or an ALD method. The electrode layer 112 is disposed on the insulating layer 110 and fills the recess R1 and the cavity C1. The electrode layer 112 may be a single-layer structure or a multilayer structure. In some embodiments, the electrode layer 112 may include a conductive layer 112a and a conductive layer 112b, but the invention is not limited thereto. The conductive layer 112a is disposed on the insulating layer 110. In some embodiments, the conductive layer 112a may be conformally disposed on the insulating layer 110. The material of the conductive layer 112a is, for example, titanium nitride, ruthenium (Ru), or platinum (Pt). The method of forming the conductive layer 112a is, for example, a CVD method, a PVD method, or an ALD method. The conductive layer 112b is disposed on the conductive layer 112a and fills the recess R1 and the cavity C1. The material of the conductive layer 112b is, for example, tungsten. The method of forming the conductive layer 112b is, for example, a CVD method or a PVD method.

Figure 1G:
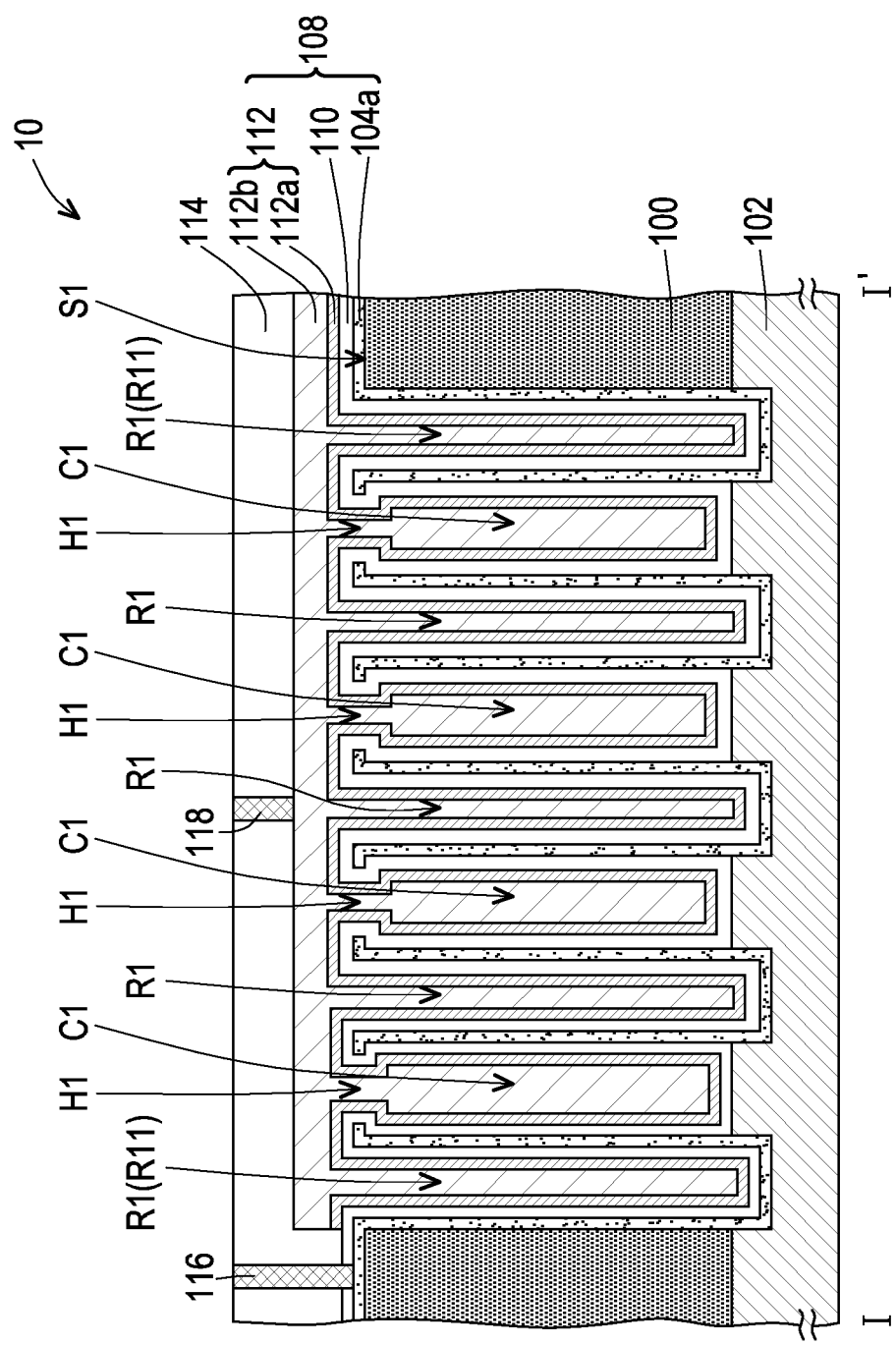

Referring to FIG. 1G, the electrode layer 112 may be patterned to define the pattern of the electrode layer 112. In some embodiments, after the electrode layer 112 is patterned, a portion of the insulating layer 110 may be exposed. A portion of the capacitor 108 may be located outside the silicon material layer 100. A portion of the support frame layer 104a may be located outside the silicon material layer 100. For example, a portion of the support frame layer 104a may be located on the top surface S1 of the silicon material layer 100. A portion of the insulating layer 110 may be located outside the silicon material layer 100. A portion of the electrode layer 112 may be located outside the silicon material layer 100. In some embodiments, the electrode layer 112 may be patterned by a lithography process and an etching process. In some embodiments, according to the product requirement, the insulating layer 110 and the support frame layer 104a may be further patterned to define the pattern of the insulating layer 110 and the pattern of the support frame layer 104*a*. In some embodiments, the insulating layer 110 and the support frame layer 104*a* may be patterned by a lithography process and an etching process.

A dielectric layer 114 may be formed on the capacitor 108. The material of the dielectric layer 114 is, for example, silicon oxide. The method of forming the dielectric layer 114 is, for example, a CVD method.

A contact 116 and a contact 118 may be formed in the dielectric layer 114. The contact 116 may pass through the insulating layer 110 to be electrically connected to the support frame layer 104*a*. The contact 118 is electrically connected to the electrode layer 112. The material of the contact 116 and the material of the contact 118 are, for example, tungsten. In some embodiments, the contact 116 and the contact 118 may be formed by a damascene process. In some embodiments, a barrier layer (not shown) may be formed between the contact 116 and the dielectric layer 114 and between the contact 116 and the support frame layer 104*a*, and a barrier layer (not shown) may be formed between the contact 118 and the dielectric layer 114 and between the contact 118 and the electrode layer 112, and the description thereof is omitted here.

Hereinafter, the capacitor structure 10 of the above embodiments is described with reference to FIG. 1G. In addition, although the method for forming the capacitor structure 10 is described by taking the above method as an example, the invention is not limited thereto.

Referring to FIG. 1G, a capacitor structure 10 includes a silicon material layer 100, a support frame layer 104*a*, and a capacitor 108. The support frame layer 104*a* is disposed in the silicon material layer 100. The support frame layer 104*a* has recesses R1. There is a cavity C1 between two adjacent recesses R1. The support frame layer 104*a* is located between the cavity C1 and the recess R1. In some embodiments, the cavity C1 and the recess R1 are separated from each other by the support frame layer 104*a*. The support frame layer 104*a* has a through hole H1 directly above the cavity C1. The capacitor 108 is disposed in the silicon material layer 100. The capacitor 108 includes an insulating layer 110 and an electrode layer 112. The insulating layer 110 is disposed on the support frame layer 104*a*. The electrode layer 112 is disposed on the insulating layer 110 and fills the recess R1 and the cavity C1. In the present embodiment, the material of the support frame layer 104*a* may be a conductive material, and the capacitor 108 may further include the support frame layer 104*a*. That is, the support frame layer 104*a* may be used as a portion of the capacitor 108. For example, the support frame layer 104*a* may be used as another electrode layer of the capacitor 108. In some embodiments, the capacitor structure 10 may further include a substrate 102. The silicon material layer 100 is disposed on the substrate 102. The silicon material layer 100 and the substrate 102 may have the same conductivity type. The dopant concentration of the silicon material layer 100 may be less than the dopant concentration of the substrate 102.

In addition, the remaining components in the capacitor structure 10 may refer to the description of the above embodiments. Moreover, the details (e.g., the material, the arrangement, and the forming method) of each component in the capacitor structure 10 have been described in detail in the above embodiments, and the description thereof is not repeated here.

Based on the above embodiments, in the capacitor structure 10 and the manufacturing method thereof, the support frame layer 104*a* has the recesses R1, and there is the cavity C1 between two adjacent recesses R1, the support frame layer 104*a* is located between the cavity C1 and the recess R1, the support frame layer 104*a* has the through hole H1 directly above the cavity C1, the insulating layer 110 is disposed on the support frame layer 104*a*, and the electrode layer 112 is disposed on the insulating layer 110 and fills the recess R1 and the cavity C1. Therefore, the electrode layer 112 can have a larger area, thereby effectively increasing the capacitance value of the capacitor 108.

Figure 4A:
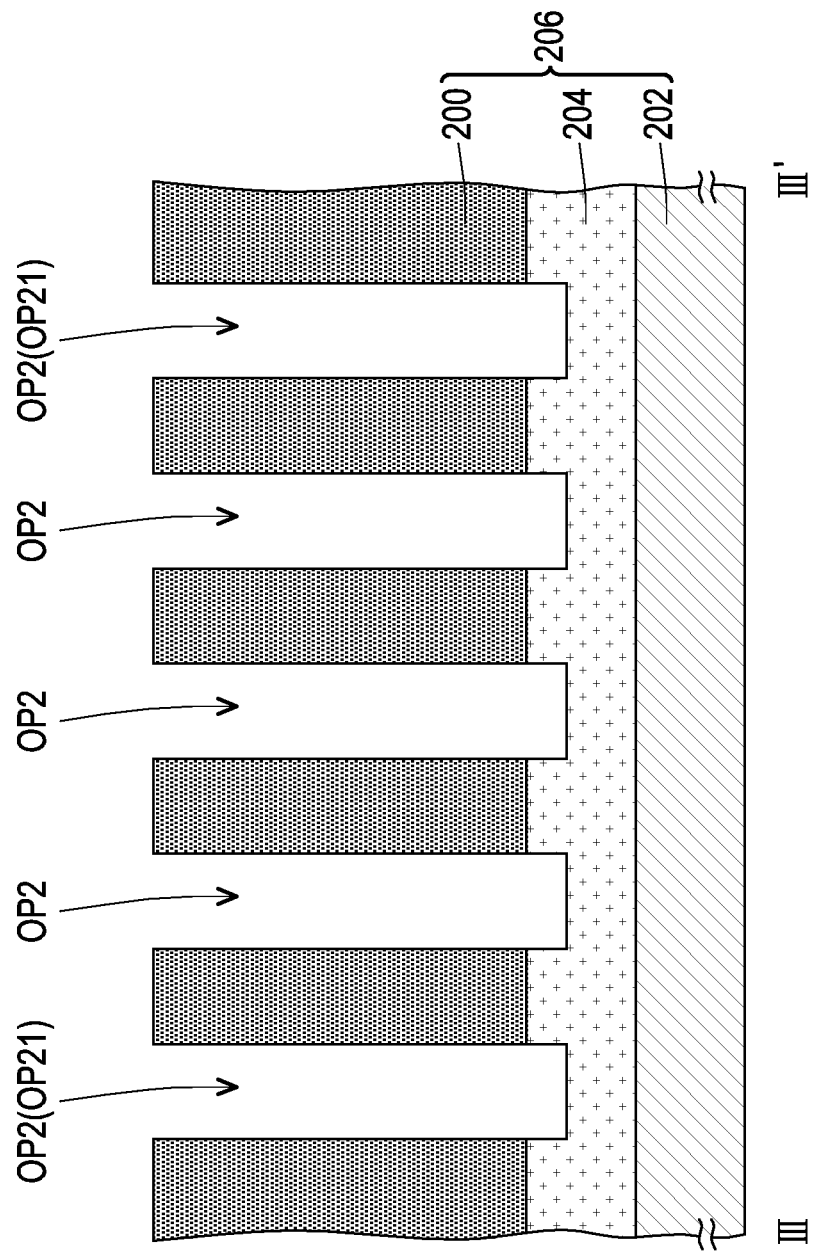
FIG. 4A to FIG. 4B are cross-sectional views illustrating a manufacturing process of a capacitor structure according to other embodiments of the invention.
Figure 4B:
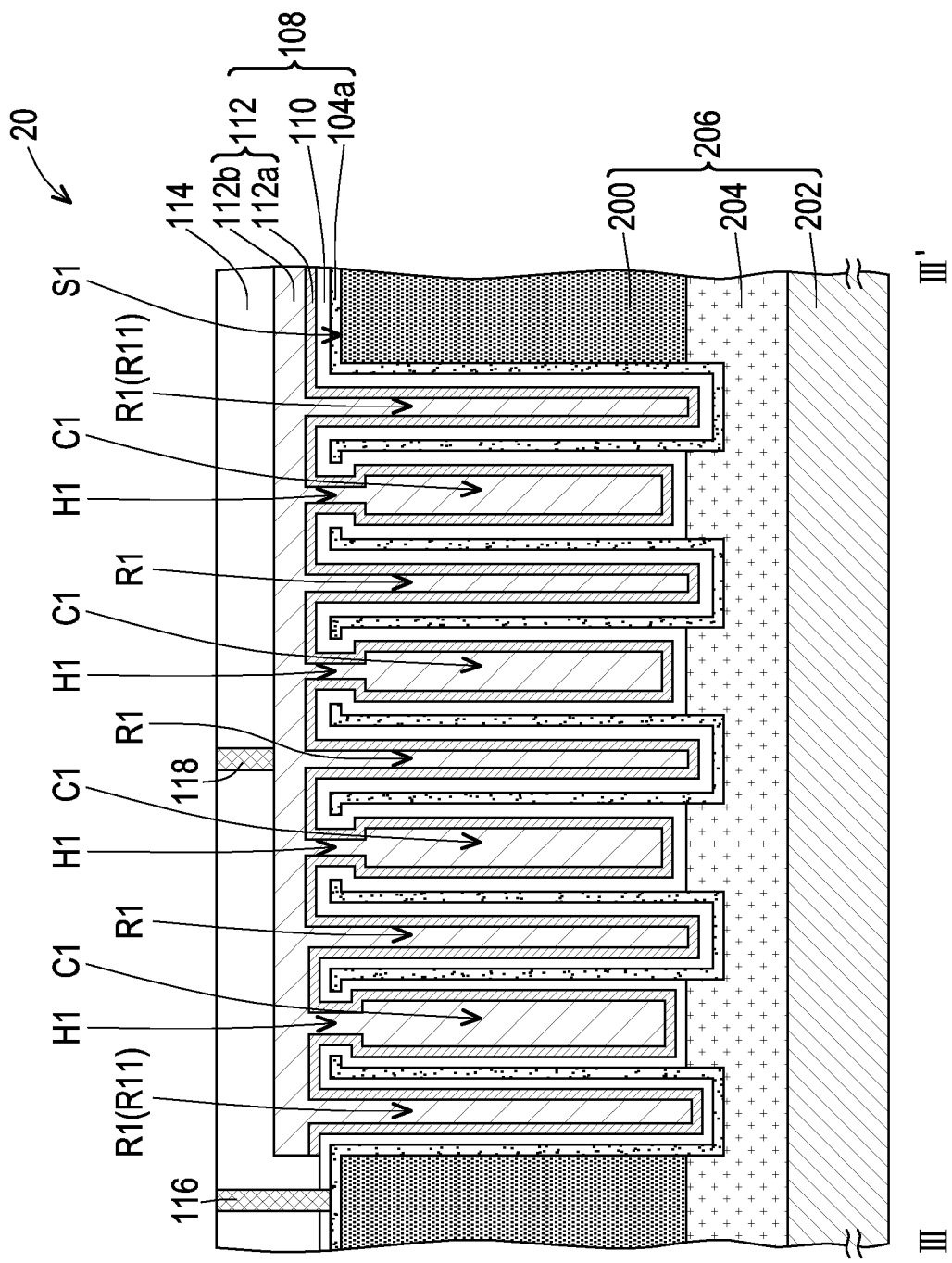
Figure 5:
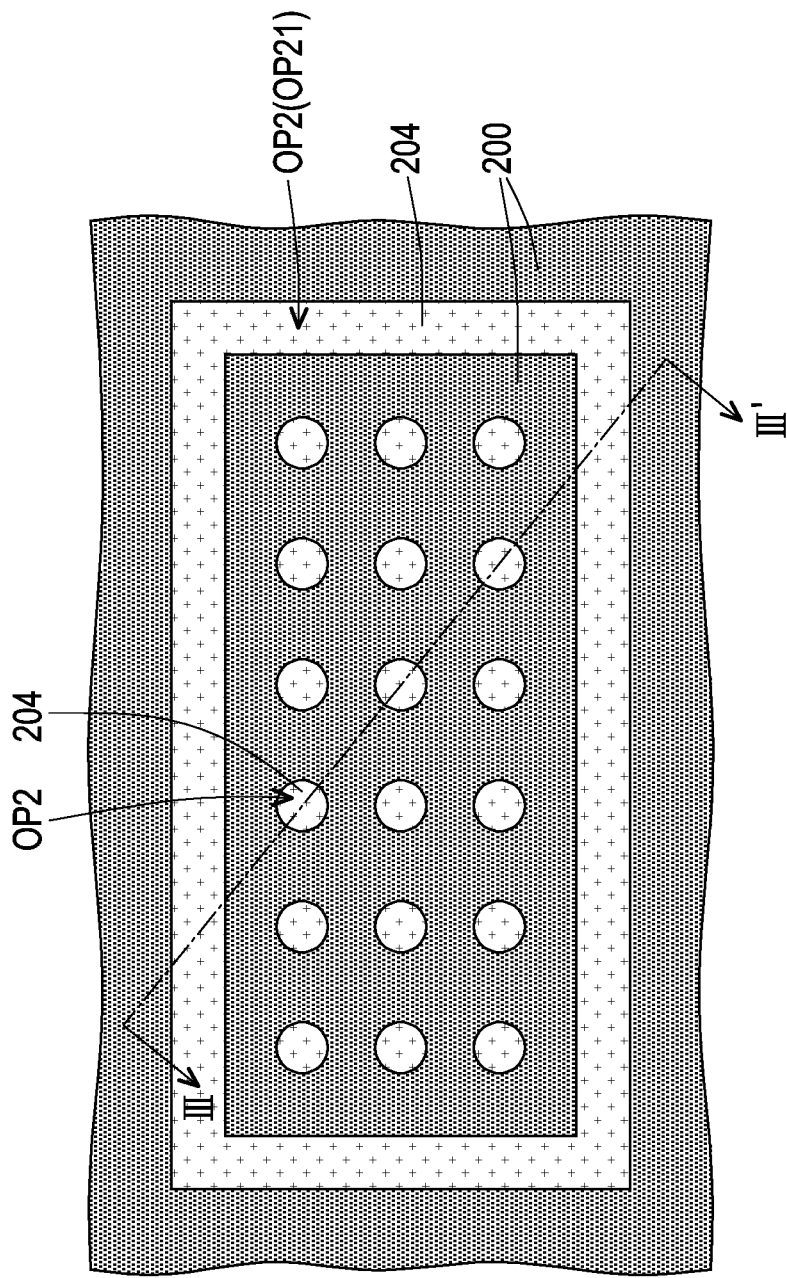
FIG. 5 is a top view illustrating one stage of a manufacturing process of a capacitor structure according to other embodiments of the invention.

FIG. 4A to FIG. 4B are cross-sectional views illustrating a manufacturing process of a capacitor structure according to other embodiments of the invention. FIG. 5 is a top view illustrating one stage of a manufacturing process of a capacitor structure according to other embodiments of the invention. FIG. 4A to FIG. 4B are cross-sectional views taken along section line III-III' in FIG. 5.

Referring to FIG. 4A and FIG. 5, a silicon material layer 200 is provided. In some embodiments, the material of the silicon material layer 200 is, for example, single crystal silicon, but the invention is not limited thereto. In some embodiments, a substrate 202 may be further provided. The substrate 202 may be a semiconductor substrate such as a single crystal silicon substrate. In some embodiments, an insulating layer 204 may be further provided. The insulating layer 204 is located between the silicon material layer 200 and the substrate 202. The material of the insulating layer 204 is, for example, silicon oxide. That is, in the present embodiment, a semiconductor-on-insulator (SOI) substrate 206 may be provided, and the SOI substrate 206 may include the silicon material layer 200, the substrate 202, and the insulating layer 204.

Opening OP2 may be formed in the silicon material layer 200. In some embodiments, the silicon material layer 200 may be patterned by a lithography process and an etching process (e.g., dry etching process) to form the openings OP2. The openings OP2 may include a ring-shaped opening OP21, and the ring-shaped opening OP21 may surround the rest of the openings OP2. In some embodiments, during the process of forming the opening OP2, a portion of the insulating layer 204 may be removed, so that the opening OP2 may extend into the insulating layer 204.

Referring to FIG. 4B, the steps as shown in FIG. 1B to FIG. 1G may be performed to form a capacitor structure 20, and the description thereof is not repeated here. In the present embodiment, in the process of forming the cavity C1, the portion of the silicon material layer 200 exposed by the through hole H1 may be removed by using the insulating layer 204 as a stop layer.

Hereinafter, the capacitor structure 20 of the above embodiments is described with reference to FIG. 4B. In addition, although the method for forming the capacitor structure 20 is described by taking the above method as an example, the invention is not limited thereto.

Referring to FIG. 4B, a capacitor structure 20 includes a silicon material layer 200, a support frame layer 104*a*, and a capacitor 108. The support frame layer 104*a* is disposed in the silicon material layer 200. The support frame layer 104*a* has recesses R1. There is a cavity C1 between two adjacent recesses R1. The support frame layer 104*a* is located between the cavity C1 and the recess R1. In some embodiments, the cavity C1 and the recess R1 are separated from each other by the support frame layer 104*a*. The support frame layer 104*a* has a through hole H1 directly above the cavity C1. The capacitor 108 is disposed in the silicon material layer 200. The capacitor 108 includes an insulating layer 110 and an electrode layer 112. The insulating layer 110 is disposed on the support frame layer 104*a*. The electrode layer 112 is disposed on the insulating layer 110 and fills the recess R1 and the cavity C1. In the present embodiment, the material of the support frame layer 104a may be a conductive material, and the capacitor 108 may further include the support frame layer 104a. That is, the support frame layer 104a may be used as a portion of the capacitor 108. For example, the support frame layer 104a may be used as another electrode layer of the capacitor 108. In some embodiments, the capacitor structure 20 may further include a substrate 202 and an insulating layer 204. The silicon material layer 200 is disposed on the substrate 202. The insulating layer 204 is disposed between the silicon material layer 200 and the substrate 202.

In addition, the remaining components in the capacitor structure 20 may refer to the description of the above embodiments. Moreover, the details (e.g., the material, the arrangement, and the forming method) of each component in the capacitor structure 20 have been described in detail in the above embodiments, and the description thereof is not repeated here.

Based on the above embodiments, in the capacitor structure 20 and the manufacturing method thereof, the support frame layer 104a has the recesses R1, and there is the cavity C1 between two adjacent recesses R1, the support frame layer 104a is located between the cavity C1 and the recess R1, the support frame layer 104a has the through hole H1 directly above the cavity C1, the insulating layer 110 is disposed on the support frame layer 104a, and the electrode layer 112 is disposed on the insulating layer 110 and fills the recess R1 and the cavity C1. Therefore, the electrode layer 112 can have a larger area, thereby effectively increasing the capacitance value of the capacitor 108.

Figure 6A:
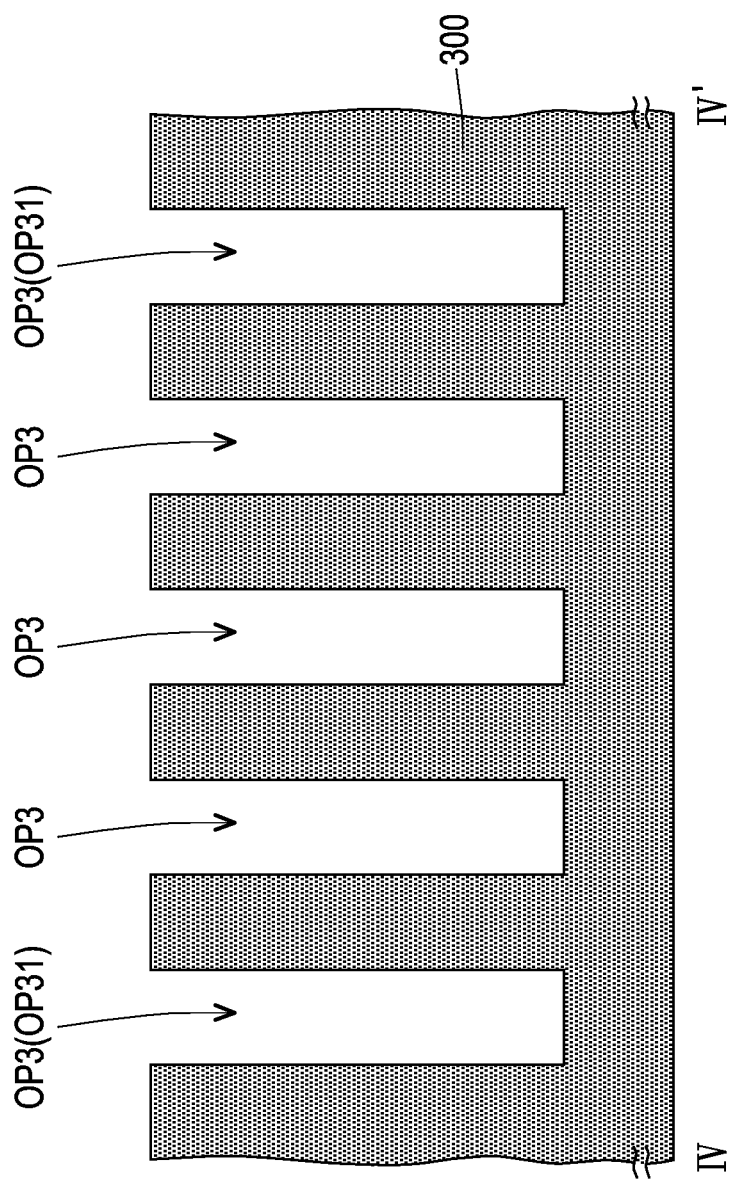
FIG. 6A to FIG. 6B are cross-sectional views illustrating a manufacturing process of a capacitor structure according to other embodiments of the invention.
Figure 6B:
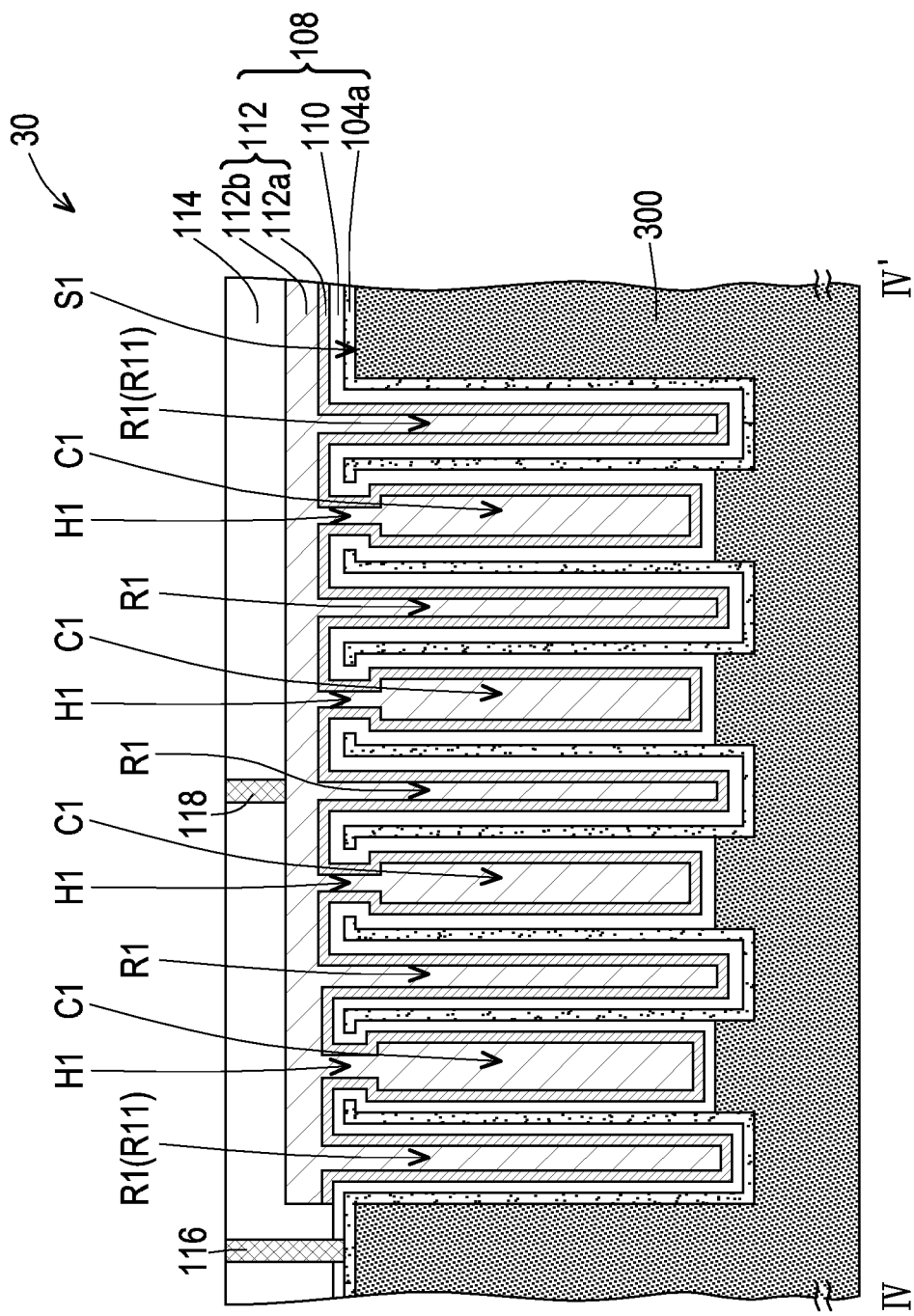
Figure 7:
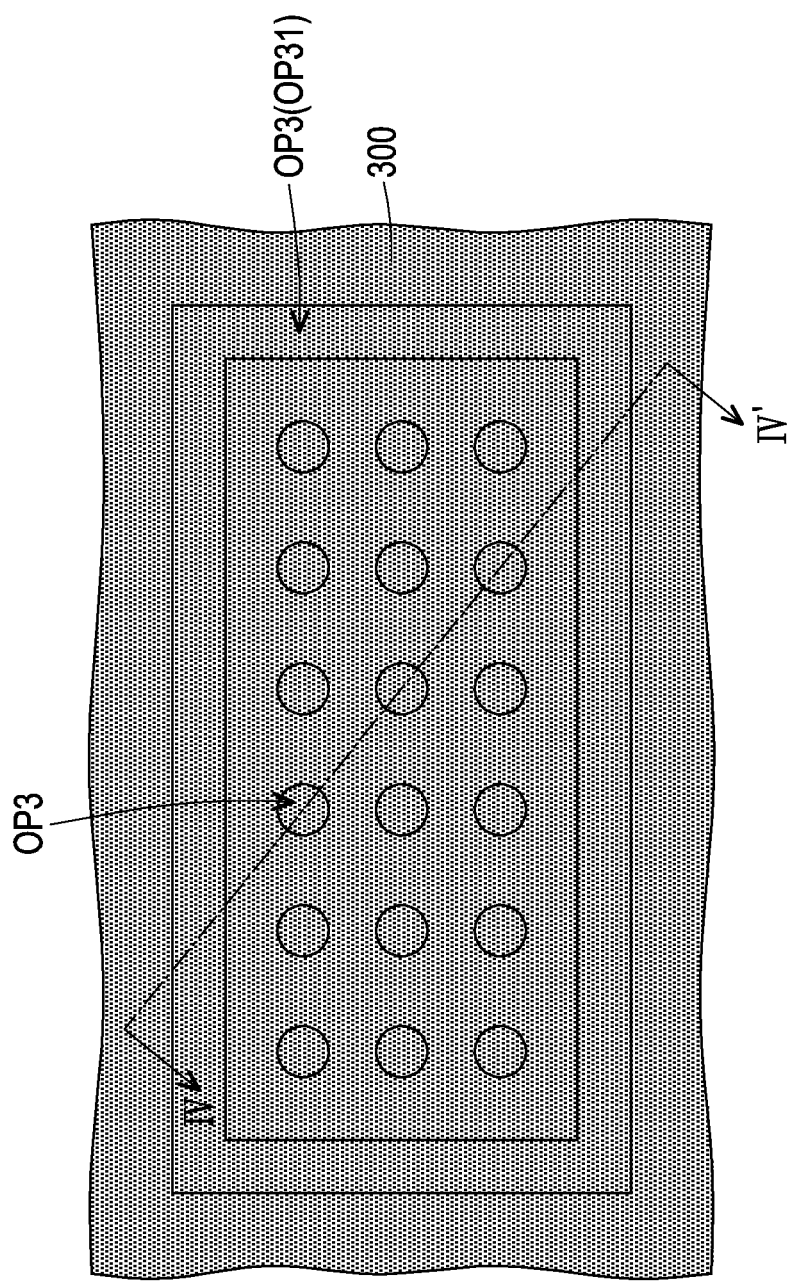
FIG. 7 is a top view illustrating one stage of a manufacturing process of a capacitor structure according to other embodiments of the invention.

FIG. 6A to FIG. 6B are cross-sectional views illustrating a manufacturing process of a capacitor structure according to other embodiments of the invention. FIG. 7 is a top view illustrating one stage of a manufacturing process of a capacitor structure according to other embodiments of the invention. FIG. 6A to FIG. 6B are cross-sectional views taken along section line IV-IV' in FIG. 7.

Referring to FIG. 6A and FIG. 7, a silicon material layer 300 is provided. In some embodiments, the material of the silicon material layer 300 is, for example, single crystal silicon, but the invention is not limited thereto. In some embodiments, the silicon material layer 300 may be a semiconductor substrate such as a single crystal silicon substrate.

Opening OP3 may be formed in the silicon material layer 300. In some embodiments, the silicon material layer 300 may be patterned by a lithography process and an etching process (e.g., dry etching process) to form the openings OP3. The openings OP3 may include a ring-shaped opening OP31, and the ring-shaped opening OP31 may surround the rest of the openings OP3.

Referring to FIG. 6B, the steps as shown in FIG. 1B to FIG. 1G may be performed to form a capacitor structure 30, and the description thereof is not repeated here. In the present embodiment, in the process of forming the cavity C1, the depth of the cavity C1 may be controlled by controlling the time of the etching process (e.g., wet etching process).

Hereinafter, the capacitor structure 30 of the above embodiments is described with reference to FIG. 6B. In addition, although the method for forming the capacitor structure 30 is described by taking the above method as an example, the invention is not limited thereto.

Referring to FIG. 6B, a capacitor structure 30 includes a silicon material layer 300, a support frame layer 104a, and a capacitor 108. The support frame layer 104a is disposed in the silicon material layer 300. The support frame layer 104a has recesses R1. There is a cavity C1 between two adjacent recesses R1. The support frame layer 104a is located between the cavity C1 and the recess R1. In some embodiments, the cavity C1 and the recess R1 are separated from each other by the support frame layer 104a. The support frame layer 104a has a through hole H1 directly above the cavity C1. The capacitor 108 is disposed in the silicon material layer 300. The capacitor 108 includes an insulating layer 110 and an electrode layer 112. The insulating layer 110 is disposed on the support frame layer 104a. The electrode layer 112 is disposed on the insulating layer 110 and fills the recess R1 and the cavity C1. In the present embodiment, the material of the support frame layer 104a may be a conductive material, and the capacitor 108 may further include the support frame layer 104a. That is, the support frame layer 104a may be used as a portion of the capacitor 108. For example, the support frame layer 104a may be used as another electrode layer of the capacitor 108.

In addition, the remaining components in the capacitor structure 30 may refer to the description of the above embodiments. Moreover, the details (e.g., the material, the arrangement, and the forming method) of each component in the capacitor structure 30 have been described in detail in the above embodiments, and the description thereof is not repeated here.

Based on the above embodiments, in the capacitor structure 30 and the manufacturing method thereof, the support frame layer 104a has the recesses R1, and there is the cavity C1 between two adjacent recesses R1, the support frame layer 104a is located between the cavity C1 and the recess R1, the support frame layer 104a has the through hole H1 directly above the cavity C1, the insulating layer 110 is disposed on the support frame layer 104a, and the electrode layer 112 is disposed on the insulating layer 110 and fills the recess R1 and the cavity C1. Therefore, the electrode layer 112 can have a larger area, thereby effectively increasing the capacitance value of the capacitor 108.

FIG. 8A to FIG. 8E are cross-sectional views illustrating a manufacturing process of a capacitor structure according to other embodiments of the invention. FIG. 9A to FIG. 9C are top views illustrating some stages of a manufacturing process of a capacitor structure according to other embodiments of the invention. FIG. 8A to FIG. 8E are cross-sectional views taken along section line V-V' in FIG. 9A to FIG. 9C. FIG. 10A and FIG. 10B are cross-sectional views illustrating some stages of a manufacturing process of a capacitor structure according to other embodiments of the invention. FIG. 10A and FIG. 10B are cross-sectional views taken along section line VI-VI' in FIG. 9C. In the top view of the present embodiment, some components in the cross-sectional view are omitted to clearly illustrate the configuration relationship between the components in the top view.

Figure 8A:
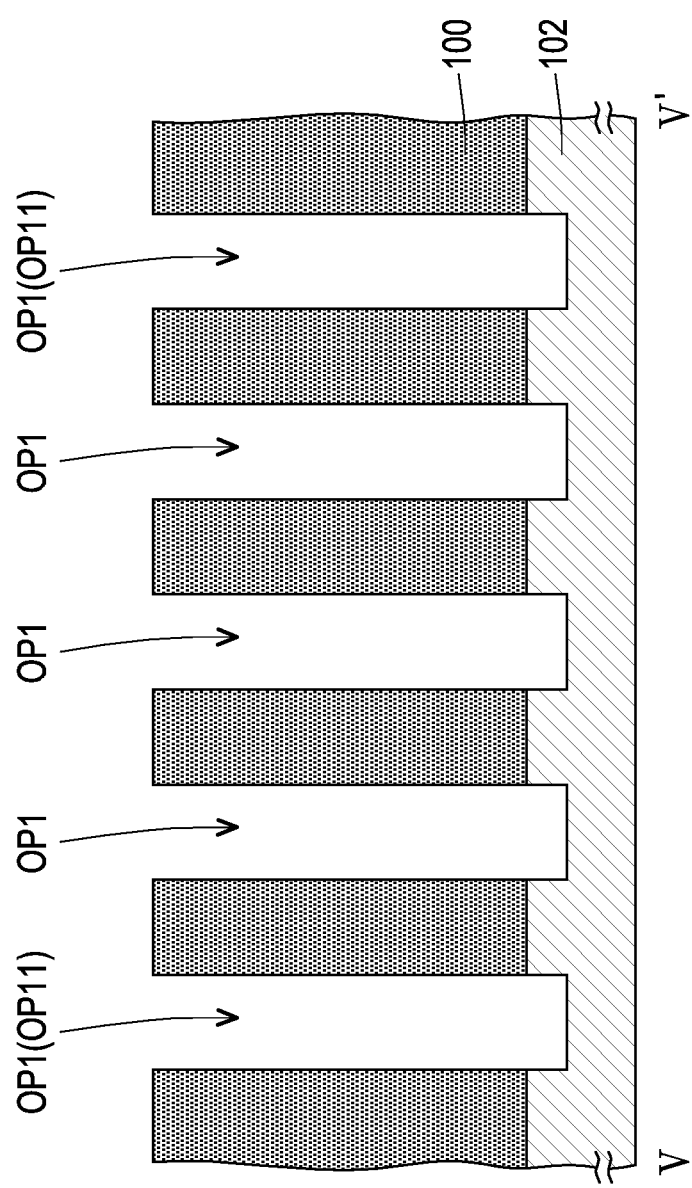
FIG. 8A to FIG. 8E are cross-sectional views illustrating a manufacturing process of a capacitor structure according to other embodiments of the invention.
Figure 9A:
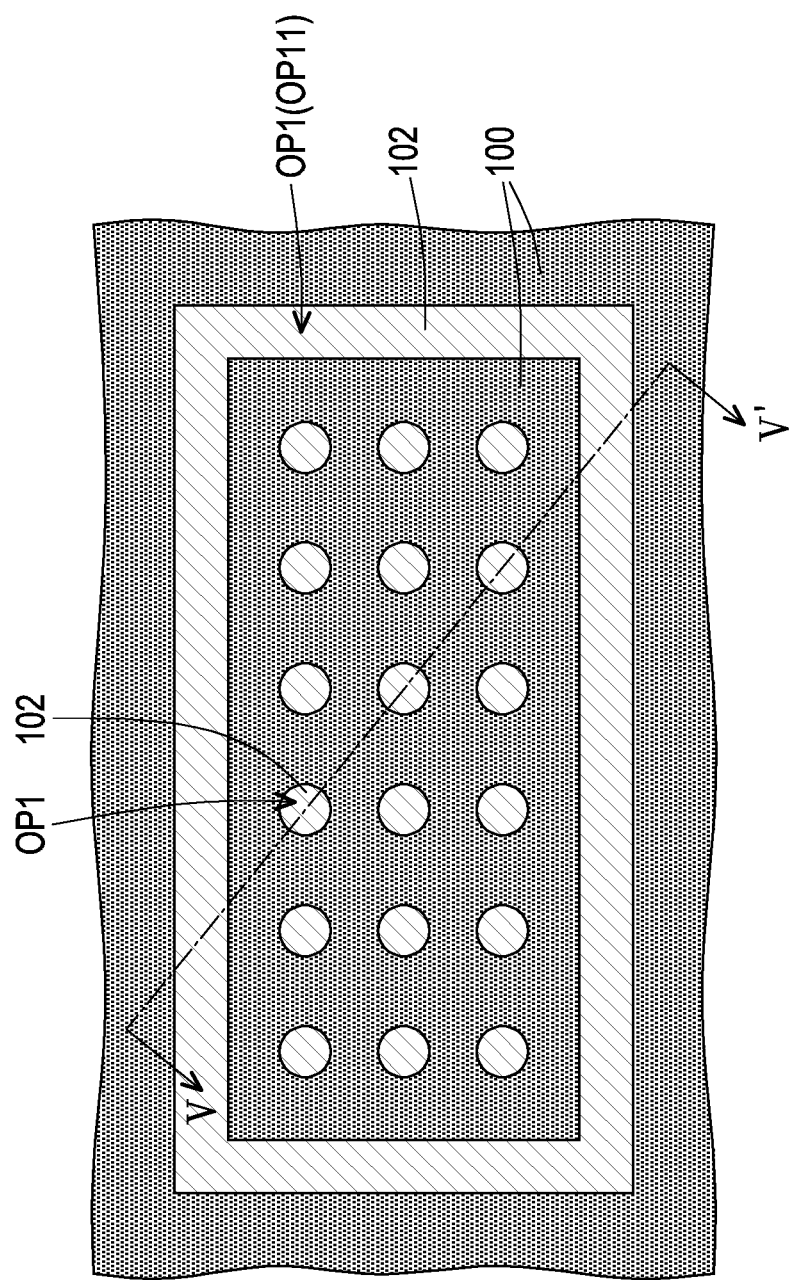
FIG. 9A to FIG. 9C are top views illustrating some stages of a manufacturing process of a capacitor structure according to other embodiments of the invention.
Figure 9B:
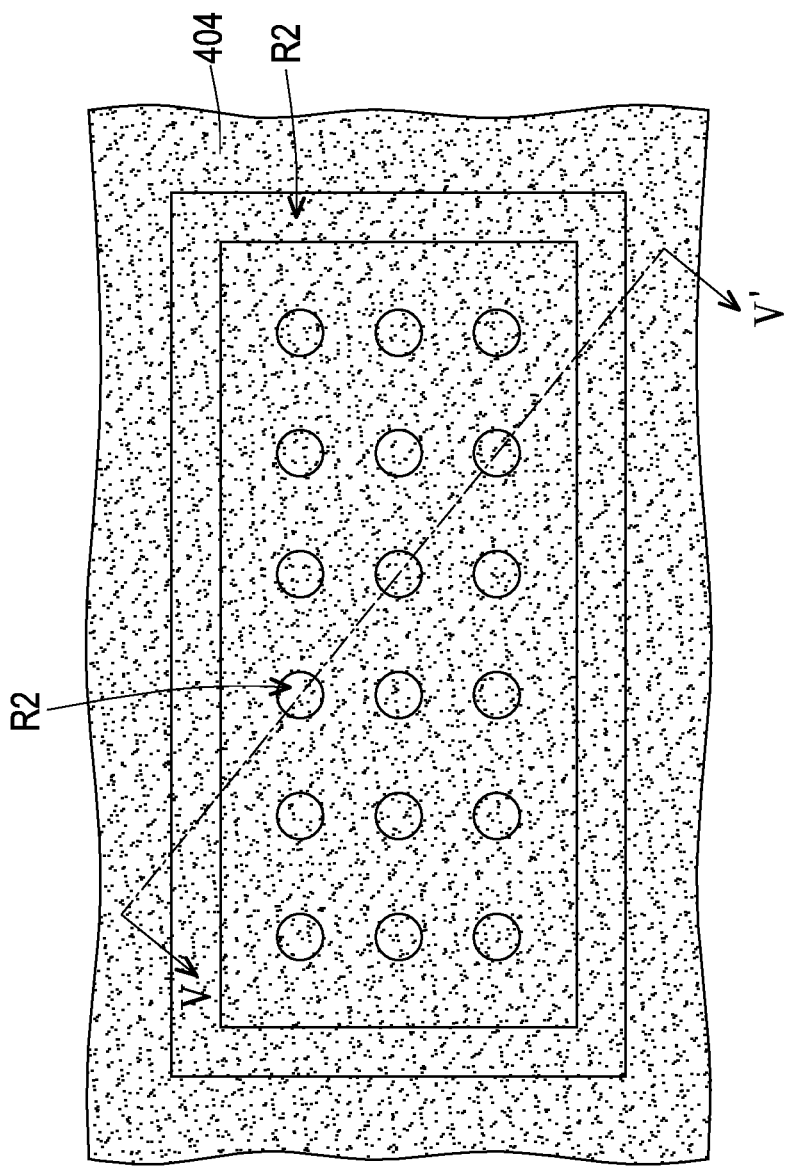
Figure 9C:
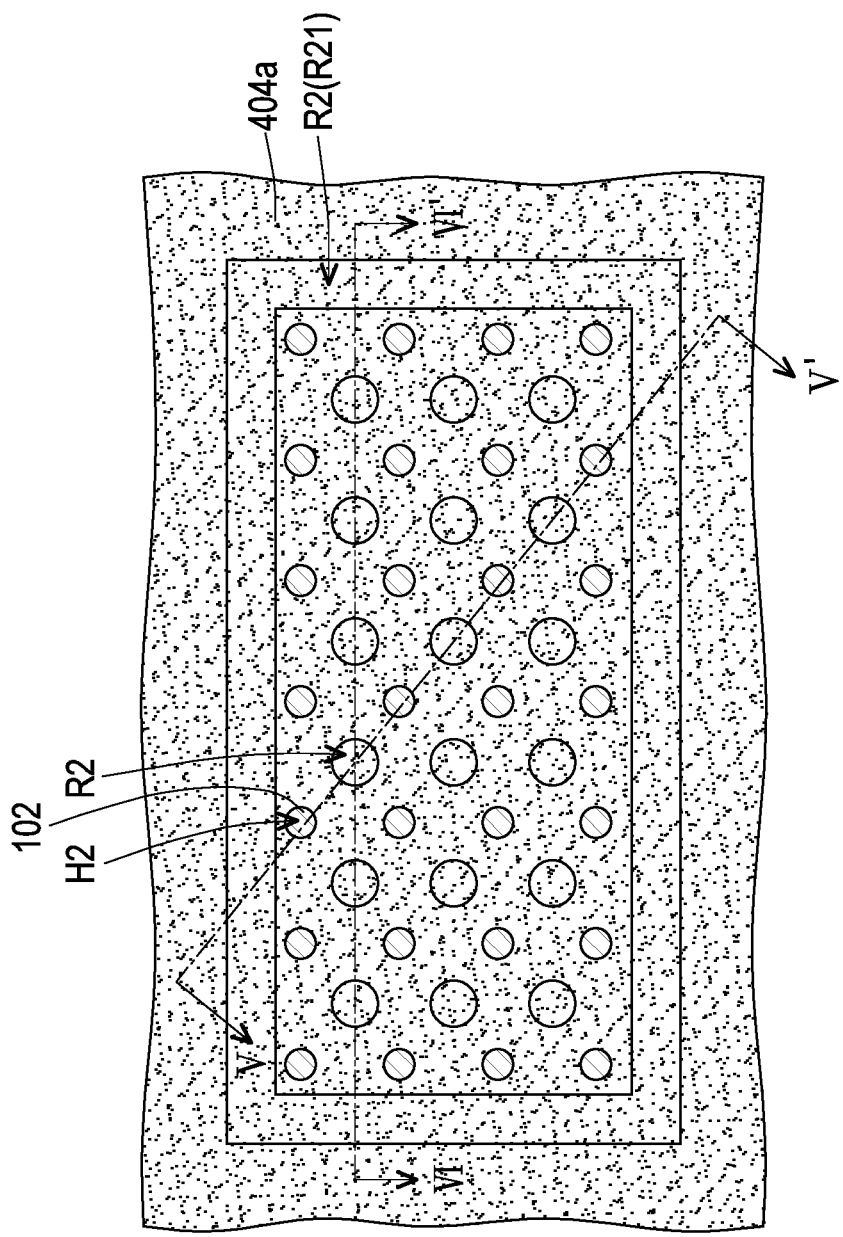
Figure 10A:
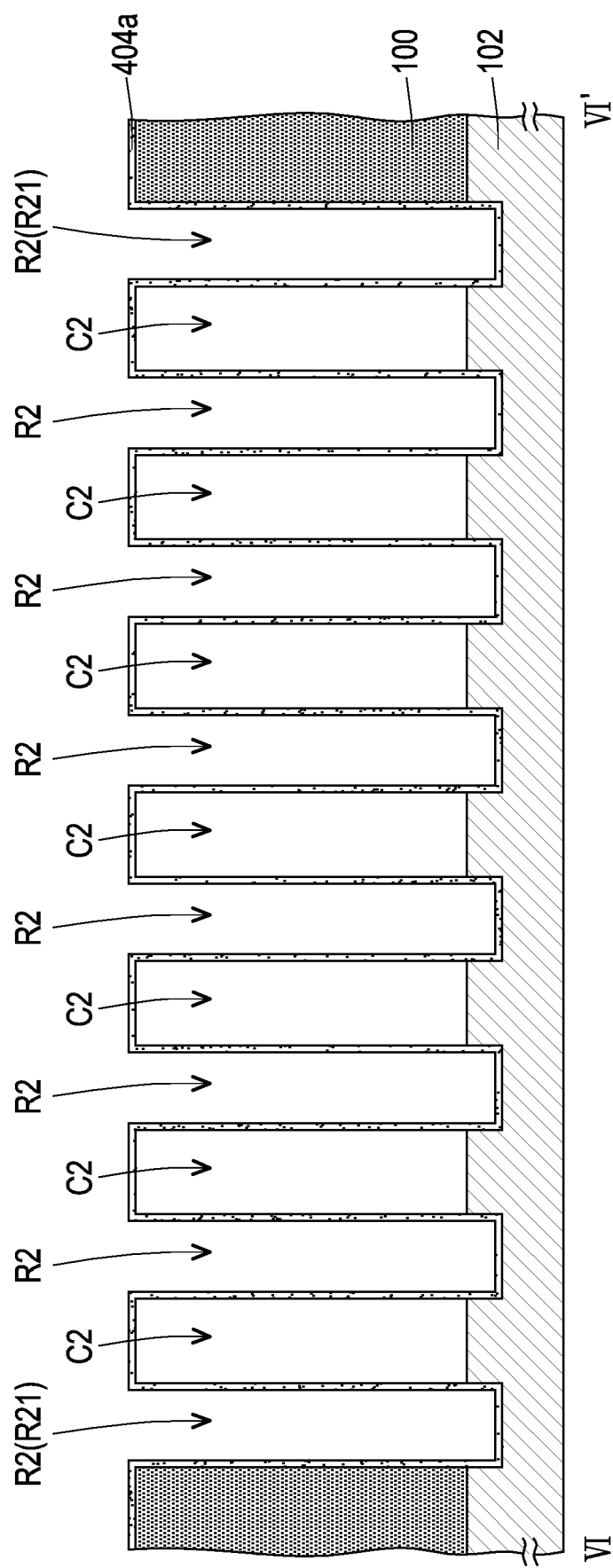
FIG. 10A and FIG. 10B are cross-sectional views illustrating some stages of a manufacturing process of a capacitor structure according to other embodiments of the invention.
Figure 10B:
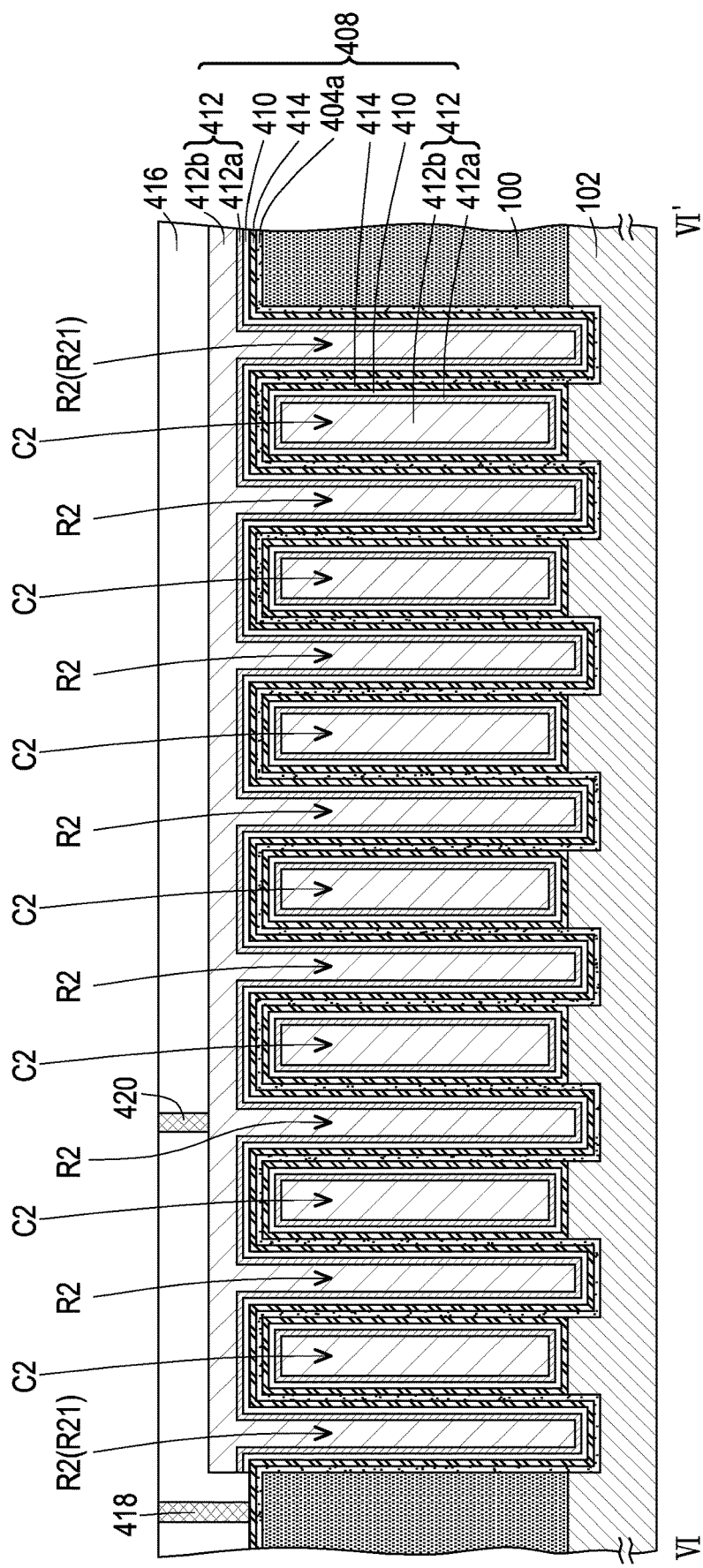

Referring to FIG. 8A and FIG. 9A, the structure of FIG. 1A and FIG. 2A is provided. The structure of FIG. 1A and FIG. 2A and the manufacturing method thereof have been described in detail in the above embodiments, and the description thereof is not repeated here.

Figure 8B:
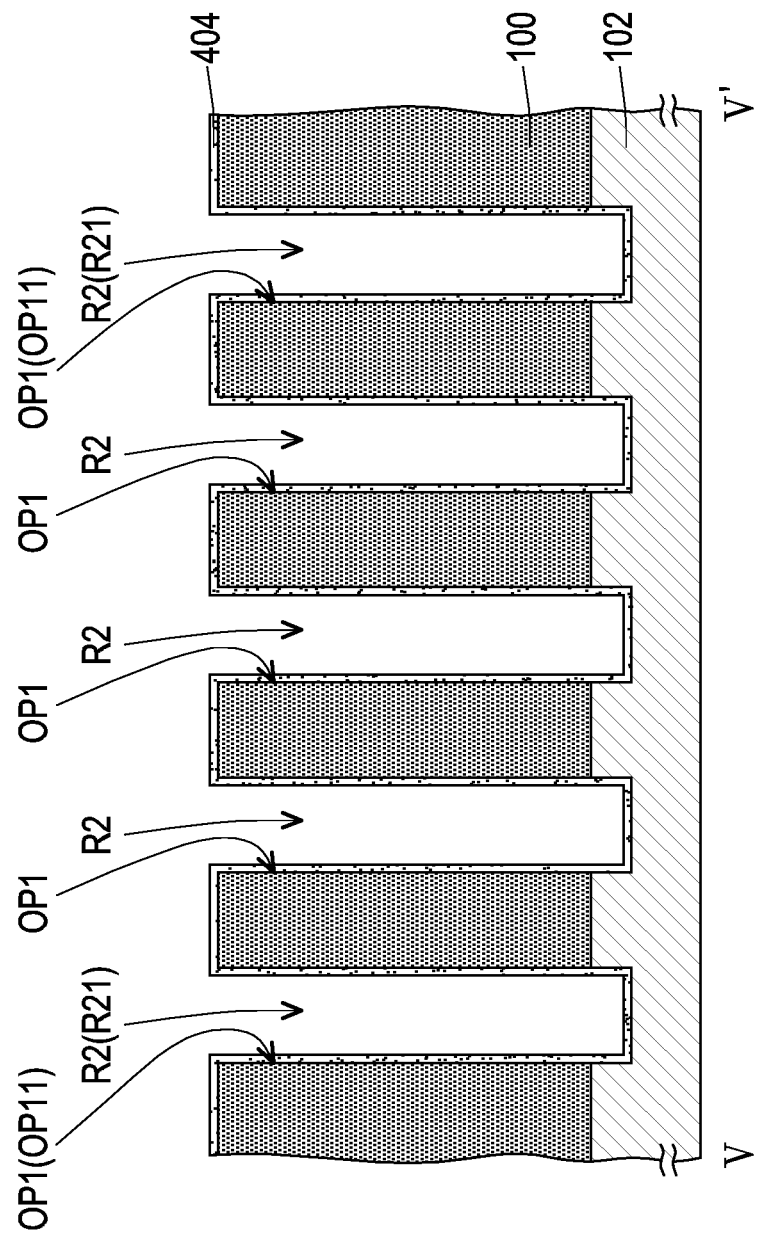

Referring to FIG. 8B and FIG. 9B, a support frame material layer 404 may be conformally formed on the silicon material layer 100 and in the openings OP1. The support frame material layer 404 may have recesses R2. In some embodiments, the material of the support frame material layer 404 may be a dielectric material such as silicon nitride, but the invention is not limited thereto. The method of forming the support frame material layer 404 is, for example, a CVD method, a PVD method, or an ALD method.

Figure 8C:
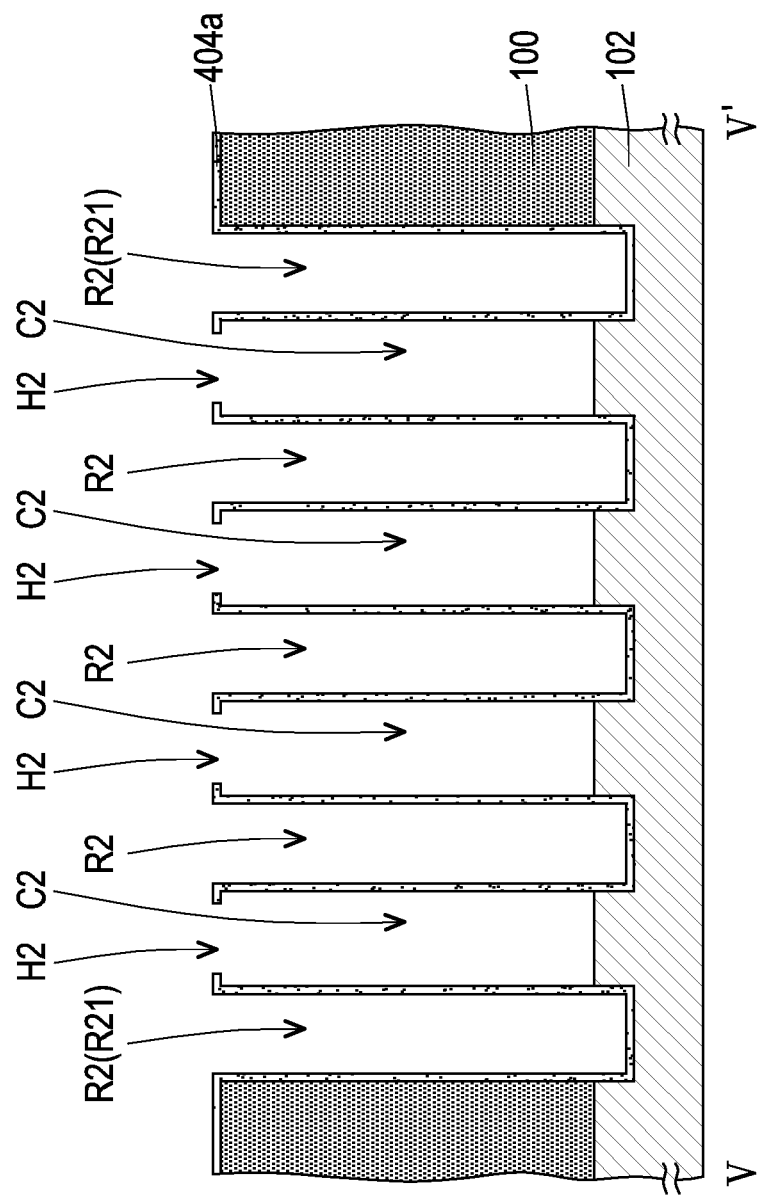

Referring to FIG. 8C, FIG. 9C, and FIG. 10A, the steps as shown in FIG. 1C to FIG. 1E may be performed to form a support frame layer 404a in the silicon material layer 100, and the description thereof is not repeated here. The support frame layer 404a has recesses R2. The recesses R2 may include a ring-shaped recess R21, and the ring-shaped recesses R21 may surround the rest of recesses R2. There is a cavity C2 between two adjacent recesses R2. The support frame layer 404a is located between the cavity C2 and the recess R2. In some embodiments, the cavity C2 and the recess R2 are separated from each other by the support frame layer 404a. The support frame layer 404a has a through hole H2 directly above the cavity C2. The material of the support frame layer 404a may be a dielectric material such as silicon nitride, but the invention is not limited thereto.

Figure 8D:
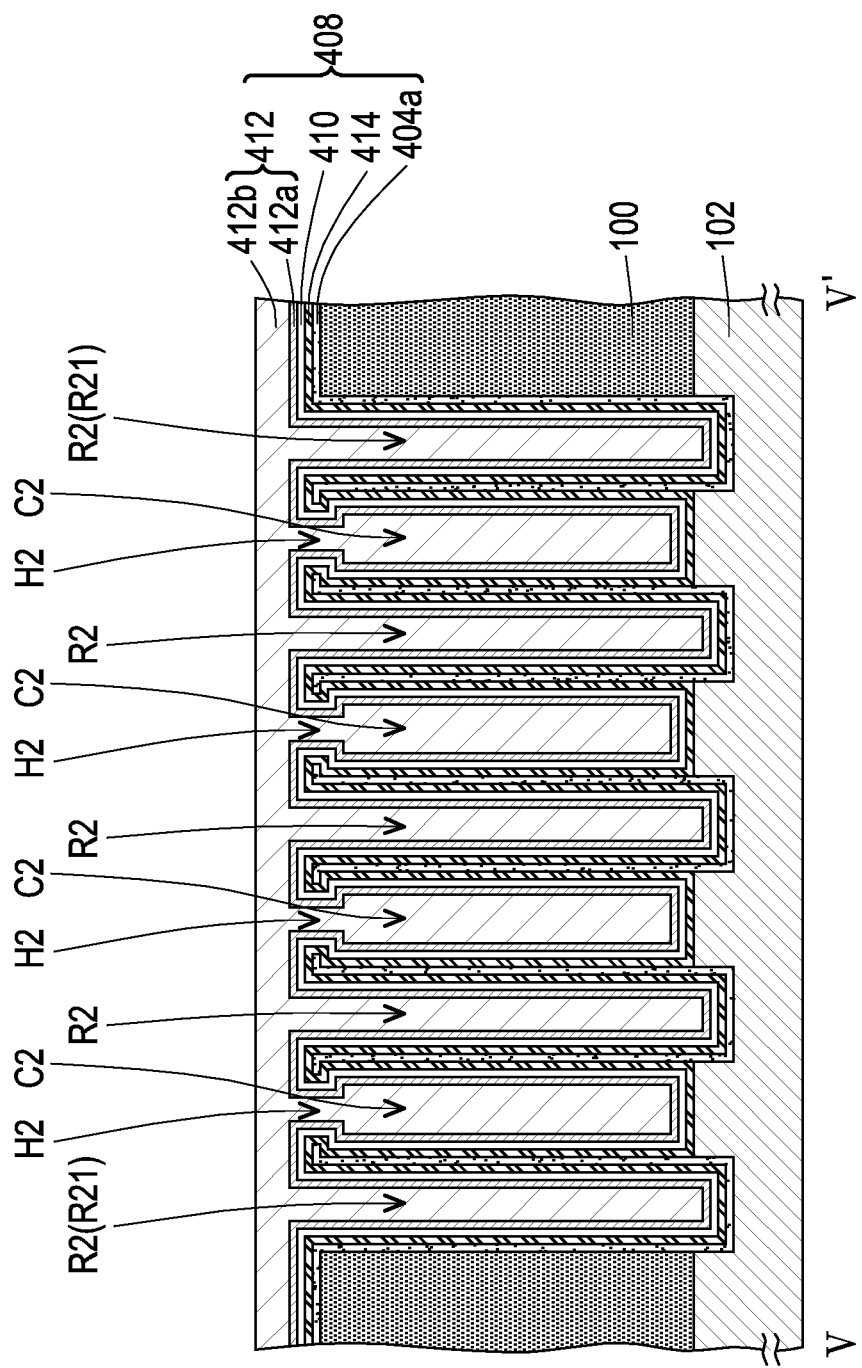

Referring to FIG. 8D and FIG. 10B, a capacitor 408 is formed in the silicon material layer 100. The capacitor 408 includes an insulating layer 410 and an electrode layer 412. The insulating layer 410 is disposed on the support frame layer 404a. The material of the insulating layer 410 is, for example, a high dielectric constant material. The method for forming the insulating layer 410 is, for example, a CVD method, a PVD method, or an ALD method. The electrode layer 412 is disposed on the insulating layer 410 and fills the recess R2 and the cavity C2. The electrode layer 412 may be a single-layer structure or a multilayer structure. In some embodiments, the electrode layer 412 may include a conductive layer 412a and a conductive layer 412b, but the invention is not limited thereto. The conductive layer 412a is disposed on the insulating layer 410. The material of the conductive layer 412a is, for example, titanium nitride, ruthenium (Ru), or platinum (Pt). The method of forming the conductive layer 412a is, for example, a CVD method, a PVD method, or an ALD method. The conductive layer 412b is disposed on the conductive layer 412a and fills the recess R2 and the cavity C2. The material of the conductive layer 412b is, for example, tungsten. The method of forming the conductive layer 412b is, for example, a CVD method or a PVD method. In the present embodiment, the material of the support frame layer 404a may be a dielectric material, and the capacitor 408 may further include an electrode layer 414. The electrode layer 414 is disposed between the insulating layer 410 and the support frame layer 404a. The material of the electrode layer 414 is, for example, titanium nitride. The method of forming the electrode layer 414 is, for example, a CVD method, a PVD method, or an ALD method. In some embodiments, the electrode layer 414 may be conformally disposed on the support frame layer 404a. In some embodiments, the insulating layer 410 may be conformally disposed on the electrode layer 414. In some embodiments, the conductive layer 412a may be conformally disposed on the insulating layer 410.

Figure 8E:
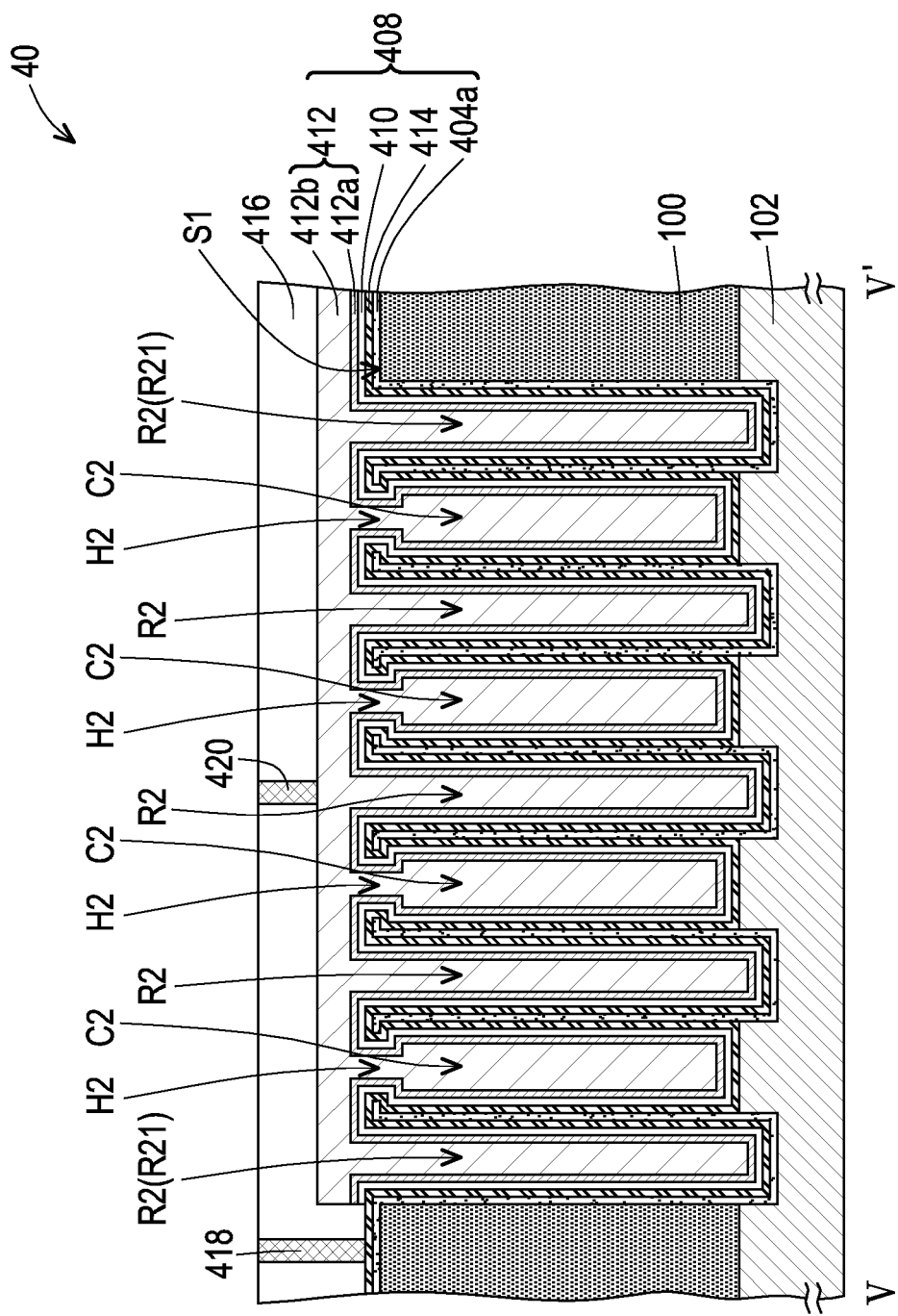

Referring to FIG. 8E, the electrode layer 412 and the insulating layer 410 may be patterned to define the pattern of the electrode layer 412 and the pattern of the insulating layer 410. In some embodiments, after the electrode layer 412 and the insulating layer 410 are patterned, a portion of the electrode layer 414 may be exposed. A portion of the capacitor 408 may be located outside the silicon material layer 100. A portion of the support frame layer 404a may be located outside the silicon material layer 100. For example, a portion of the support frame layer 404a may be located above the top surface S1 of the silicon material layer 100. A portion of the insulating layer 410 may be located outside the silicon material layer 100. A portion of the electrode layer 412 may be located outside the silicon material layer 100. A portion of the electrode layer 414 may be located outside the silicon material layer 100. In some embodiments, the electrode layer 412 and the insulating layer 410 may be patterned by a lithography process and an etching process. In some embodiments, according to the product requirement, the electrode layer 414 may be further patterned to define the pattern of the electrode layer 414. In some embodiments, the electrode layer 414 may be patterned by a lithography process and an etching process.

A dielectric layer 416 may be formed on the capacitor 408. The material of the dielectric layer 416 is, for example, silicon oxide. The method of forming the dielectric layer 416 is, for example, a CVD method.

A contact 418 and a contact 420 may be formed in the dielectric layer 416. The contact 418 is electrically connected to the electrode layer 414. The contact 420 is electrically connected to the electrode layer 412. The material of the contact 418 and the material of the contact 420 are, for example, tungsten. In some embodiments, the contact 418 and the contact 420 may be formed by a damascene process. In some embodiments, a barrier layer (not shown) may be formed between the contact 418 and the dielectric layer 416 and between the contact 418 and the electrode layer 414, and a barrier layer (not shown) may be formed between the contact 420 and the dielectric layer 416 and between the contact 420 and the electrode layer 412, and the description thereof is omitted here.

Hereinafter, the capacitor structure 40 of the above embodiments is described with reference to FIG. 8E. In addition, although the method for forming the capacitor structure 40 is described by taking the above method as an example, the invention is not limited thereto.

Referring to FIG. 8E, a capacitor structure 40 includes a silicon material layer 100, a support frame layer 404a, and a capacitor 408. The support frame layer 404a is disposed in the silicon material layer 100. The support frame layer 404a has recesses R2. There is a cavity C2 between two adjacent recesses R2. The support frame layer 404a is located between the cavity C2 and the recess R2. In some embodiments, the cavity C2 and the recess R2 are separated from each other by the support frame layer 404a. The support frame layer 404a has a through hole H2 directly above the cavity C2. The capacitor 408 is disposed in the silicon material layer 100. The capacitor 408 includes an insulating layer 410 and an electrode layer 412. The insulating layer 410 is disposed on the support frame layer 404a. The electrode layer 412 is disposed on the insulating layer 410 and fills the recess R2 and the cavity C2. The material of the support frame layer 404a may be a dielectric material, and the capacitor 408 may further include an electrode layer 414. The electrode layer 414 is disposed between the insulating layer 410 and the support frame layer 404a. In some embodiments, the capacitor structure 40 may further include a substrate 102. The silicon material layer 100 is disposed on the substrate 102. The silicon material layer 100 and the substrate 102 may have the same conductivity type. The dopant concentration of the silicon material layer 100 may be less than the dopant concentration of the substrate 102.

In addition, the remaining components in the capacitor structure 40 may refer to the description of the above embodiments. Moreover, the details (e.g., the material, the arrangement, and the forming method) of each component in the capacitor structure 40 have been described in detail in the above embodiments, and the description thereof is not repeated here.

Based on the above embodiments, in the capacitor structure 40 and the manufacturing method thereof, the support frame layer 404a has the recesses R2, and there is the cavity C2 between two adjacent recesses R2, the support frame layer 404a is located between the cavity C2 and the recess R2, the support frame layer 404a has the through hole H2 directly above the cavity C2, the insulating layer 410 is disposed on the support frame layer 404a, and the electrode layer 412 is disposed on the insulating layer 410 and fills the recess R2 and the cavity C2. Therefore, the electrode layer 412 can have a larger area, thereby effectively increasing the capacitance value of the capacitor 408.

In other embodiments, the silicon material layer 100 and the substrate 102 in the capacitor structure 40 may be replaced with the SOI substrate 206 in FIG. 4B. In other embodiments, the silicon material layer 100 and the substrate 102 in the capacitor structure 40 may be replaced with the silicon material layer 300 in FIG. 6B.

Figure 11:
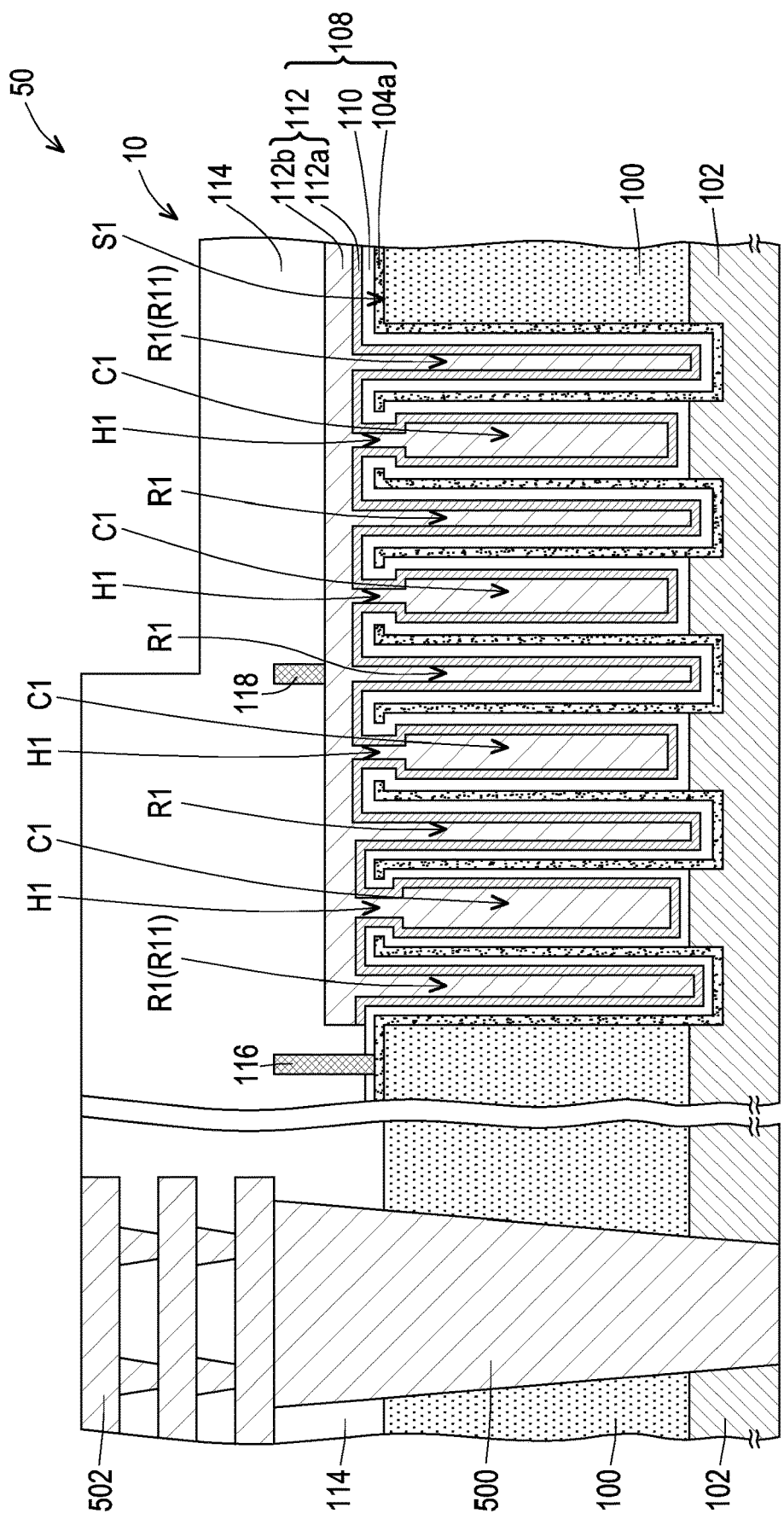
FIG. 11 is a cross-sectional view illustrating a semiconductor structure according to some embodiments of the invention.

FIG. 11 is a cross-sectional view illustrating a semiconductor structure according to some embodiments of the invention.

Referring to FIG. 11, the capacitor structure 10 of FIG. 1G may be integrated into a semiconductor structure 50. In some embodiments, the semiconductor structure 50 may be an interposer structure, but the invention is not limited thereto. The semiconductor structure 50 may include a capacitor structure 10, a through-substrate via (TSV) 500, and an interconnect structure 502. In some embodiments, the dielectric layer 114 may be a multilayer structure. The TSV 500 may pass through the silicon material layer 100 and the substrate 102. Furthermore, a portion of the TSV 500 may be located in the dielectric layer 114. The interconnect structure 502 is disposed in the dielectric layer 114 and is electrically connected to the TSV 500. In addition, the contact 116 and the contact 118 may be electrically connected to different interconnect structures (not shown).

On the other hand, the capacitor structure 20 of FIG. 4B, the capacitor structure 30 of FIG. 6B, and the capacitor structure 40 of FIG. 8E may also be integrated into semiconductor structures such as interposer structures.

In summary, in the capacitor structure and the manufacturing method thereof in aforementioned embodiments, the support frame layer has the recesses, there is the cavity between two adjacent recesses, the support frame layer is located between the cavity and the recess, the support frame layer has the through hole directly above the cavity, the insulating layer is disposed on the support frame layer, and the electrode layer is disposed on the insulating layer and fills the recess and the cavity. Therefore, the electrode layer can have a larger area, thereby effectively increasing the capacitance value of the capacitor.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a capacitor structure, comprising:
   providing a silicon material layer;
   forming a support frame layer in the silicon material layer, wherein the support frame layer has recesses, and there is a cavity between two adjacent recesses, the support frame layer is located between the cavity and the recess, and the support frame layer has a through hole directly above the cavity; and
   forming a capacitor in the silicon material layer, wherein the capacitor comprises:
   a first insulating layer disposed on the support frame layer; and
   a first electrode layer disposed on the first insulating layer and filling the recess and the cavity,
   wherein a method of forming the support frame layer comprises:
   forming openings in the silicon material layer;
   conformally forming a support frame material layer on the silicon material layer and in the openings; and
   patterning the support frame material layer to form the support frame layer and the through hole, wherein the through hole exposes the silicon material layer.

2. The manufacturing method of the capacitor structure according to claim 1, wherein the openings comprise a ring-shaped opening, and the ring-shaped opening surrounds the rest of the openings.

3. The manufacturing method of the capacitor structure according to claim 1, wherein
   a method of forming the cavity comprises removing a portion of the silicon material layer exposed by the through hole, and
   a method of removing the portion of the silicon material layer exposed by the through hole comprises a wet etching method.

4. The manufacturing method of the capacitor structure according to claim 3, further comprising:
   providing a substrate, wherein the silicon material layer is formed on the substrate, the silicon material layer and the substrate have the same conductivity type, and a dopant concentration of the silicon material layer is less than a dopant concentration of the substrate.

5. The manufacturing method of the capacitor structure according to claim 4, wherein the portion of the silicon material layer exposed by the through hole is removed by using the substrate as a stop layer.

6. The manufacturing method of the capacitor structure according to claim 3, further comprising:
   providing a substrate; and
   providing a second insulating layer, wherein the second insulating layer is located between the silicon material layer and the substrate.

7. The manufacturing method of the capacitor structure according to claim 6, wherein the portion of the silicon material layer exposed by the through hole is removed by using the second insulating layer as a stop layer.

8. The manufacturing method of the capacitor structure according to claim 1, wherein a material of the support frame layer is a conductive material, and the capacitor further comprises the support frame layer.

9. The manufacturing method of the capacitor structure according to claim 1, wherein a material of the support frame layer is a dielectric material, and the capacitor further comprises:
   a second electrode layer disposed between the first insulating layer and the support frame layer.

* * * * *